US010978165B2

(12) United States Patent
Nishikawa et al.

(10) Patent No.: US 10,978,165 B2
(45) Date of Patent: Apr. 13, 2021

(54) MEMORY SYSTEM AND NON-VOLATILE SEMICONDUCTOR MEMORY

(71) Applicant: Toshiba Memory Corporation, Minato-ku (JP)

(72) Inventors: Suguru Nishikawa, Osaka (JP); Yoshihisa Kojima, Kawasaki (JP); Masanobu Shirakawa, Chigasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/435,694

(22) Filed: Jun. 10, 2019

(65) Prior Publication Data
US 2020/0013470 A1    Jan. 9, 2020

(30) Foreign Application Priority Data

Jul. 5, 2018   (JP) .............................. JP2018-128320

(51) Int. Cl.
| G11C 16/34 | (2006.01) |
| G11C 16/10 | (2006.01) |
| G11C 11/56 | (2006.01) |
| G11C 16/04 | (2006.01) |
| H01L 27/11582 | (2017.01) |

(52) U.S. Cl.
CPC ...... *G11C 16/3459* (2013.01); *G11C 11/5671* (2013.01); *G11C 16/0483* (2013.01); *G11C 16/10* (2013.01); *G11C 16/3413* (2013.01); *G11C 16/3463* (2013.01); *G11C 16/3495* (2013.01); *G11C 2211/5621* (2013.01); *H01L 27/11582* (2013.01)

(58) Field of Classification Search
None
See application file for complete search history.

(56) References Cited

U.S. PATENT DOCUMENTS

| 6,907,497 | B2 | 6/2005 | Hosono et al. | |
| 6,999,343 | B2* | 2/2006 | Shim | G11C 16/3404 |
| | | | | 365/185.17 |
| 7,453,737 | B2 | 11/2008 | Ha | |
| 10,224,107 | B1* | 3/2019 | Sule | G11C 16/10 |
| 2009/0168524 | A1* | 7/2009 | Golov | G11C 16/3495 |
| | | | | 365/185.09 |

FOREIGN PATENT DOCUMENTS

| JP | 10-055691 | 2/1998 |
| JP | 3850791 | 11/2006 |

\* cited by examiner

*Primary Examiner* — James G Norman
(74) *Attorney, Agent, or Firm* — Oblon, McClelland, Maier & Neustadt, L.L.P.

(57) ABSTRACT

According to one embodiment, a memory system includes a non-volatile semiconductor memory that includes a memory cell and a controller having a memory storing a write parameter used in a write operation to the memory cell. The controller instructs the non-volatile semiconductor memory to perform the write operation to the memory cell using the write parameter, receives, from the non-volatile semiconductor memory, a result of checking of the write parameter which is obtained in the write operation and updates the write parameter stored in the memory on the basis of the result of checking of the write parameter.

22 Claims, 37 Drawing Sheets

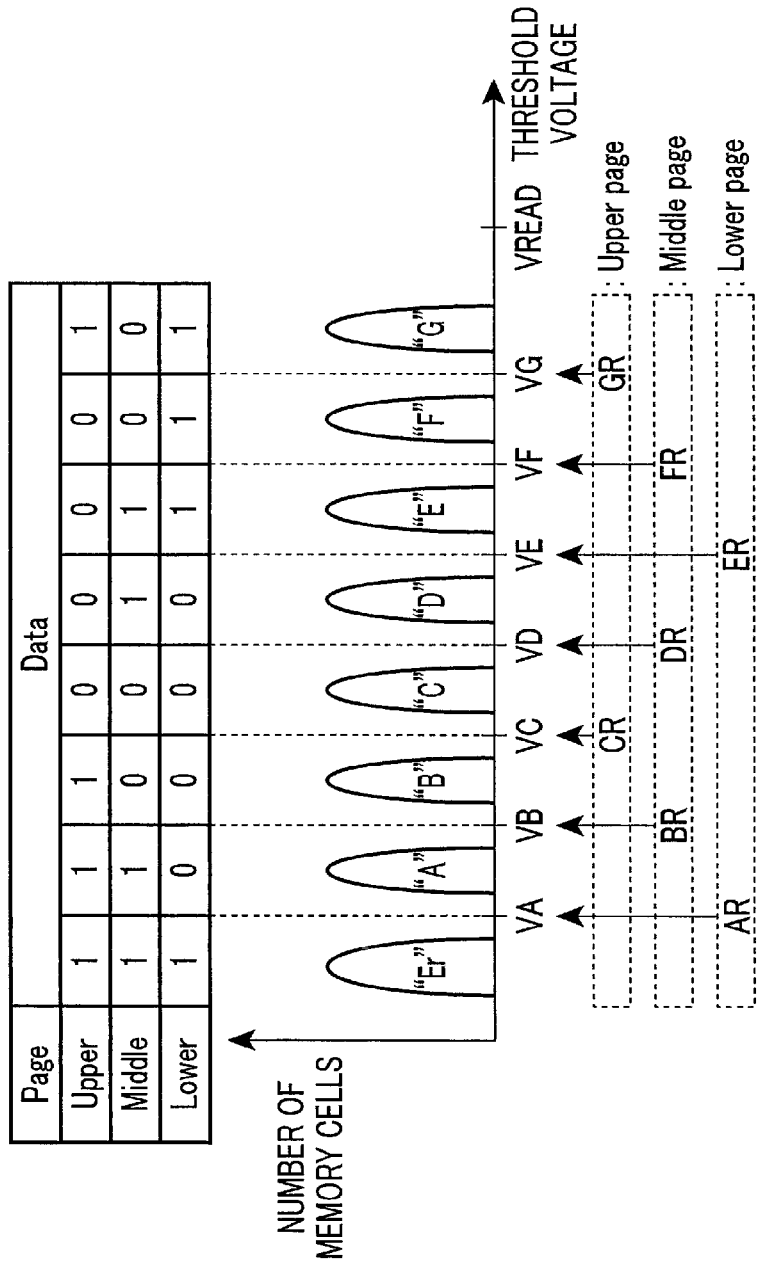
F I G. 4

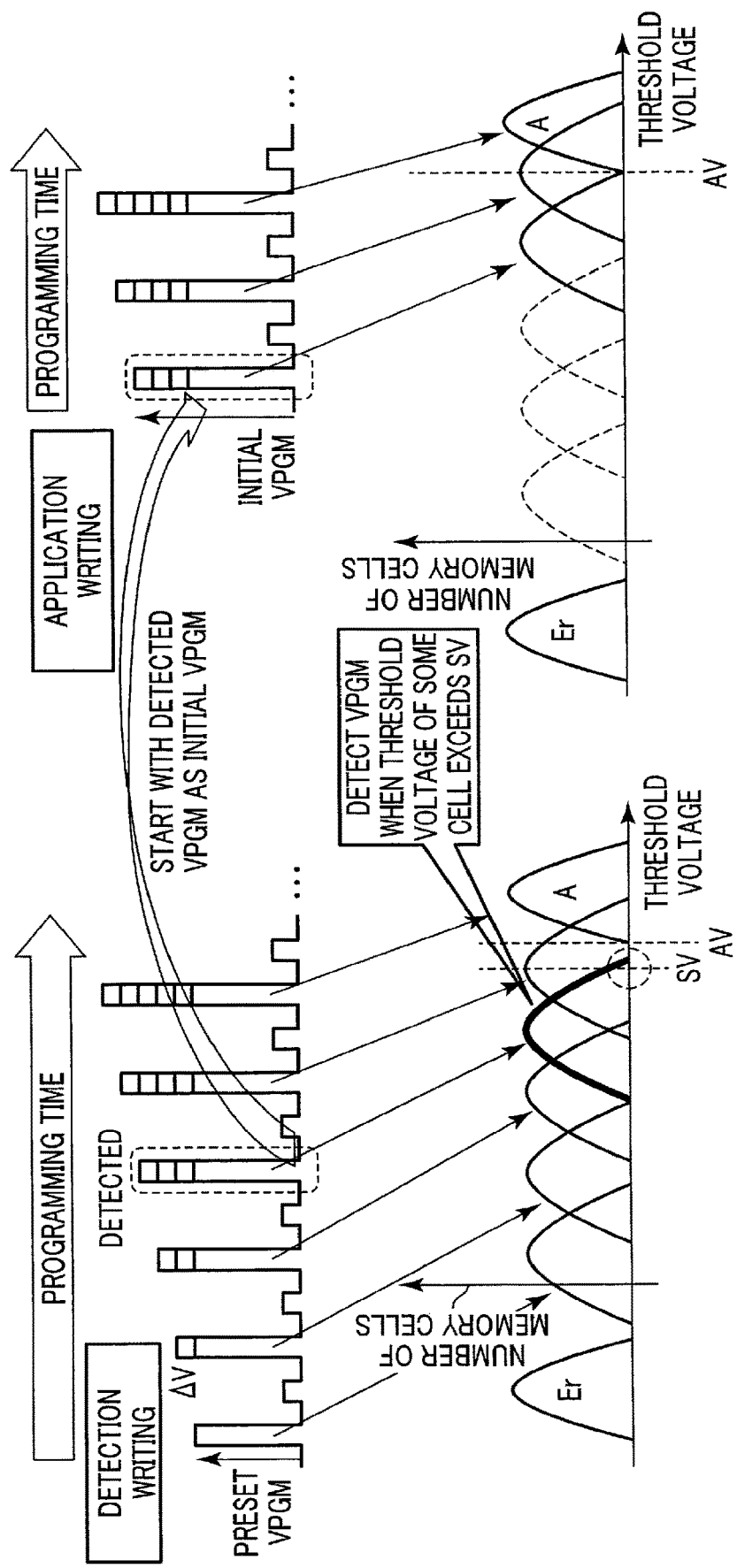
F I G. 5

220A_1

|  | WL TO START WITH | WL TO END WITH |
|---|---|---|
| GR 0 | 0 | 7 |
| GR 1 | 8 | 23 |
| GR 2 | 24 | 39 |
| GR 3 | 40 | 47 |

F I G. 7A

220A_2

|  | GR 0 | GR 1 | GR 2 | GR 3 |
|---|---|---|---|---|
| BLK 0 | ... | ... | ... | ... |
| BLK 1 | A10 | A11 | A12 | A13 |
| BLK 2 | ... | ... | ... | ... |
| BLK 3 | ... | ... | ... | ... |
| ... | ... | ... | ... | ... |

F I G. 7B

220A_3

|  | P/E cycle |
|---|---|
| TIMING 1 | 100 |
| TIMING 2 | 300 |
| TIMING 3 | 500 |
| TIMING 4 | 700 |
| ... | ... |

F I G. 7C

|  | GR 0 | GR 1 | GR 2 | GR 3 |
|---|---|---|---|---|
| BLK 0 | 100 | 150 | 200 | 250 |
| BLK 1 | ... | ... | ... | ... |
| BLK 2 | 100→300 | 150 | 200 | 250 |
| BLK 3 | ... | ... | ... | ... |
| ... | ... | ... | ... | ... |

220A_4

F I G. 7D

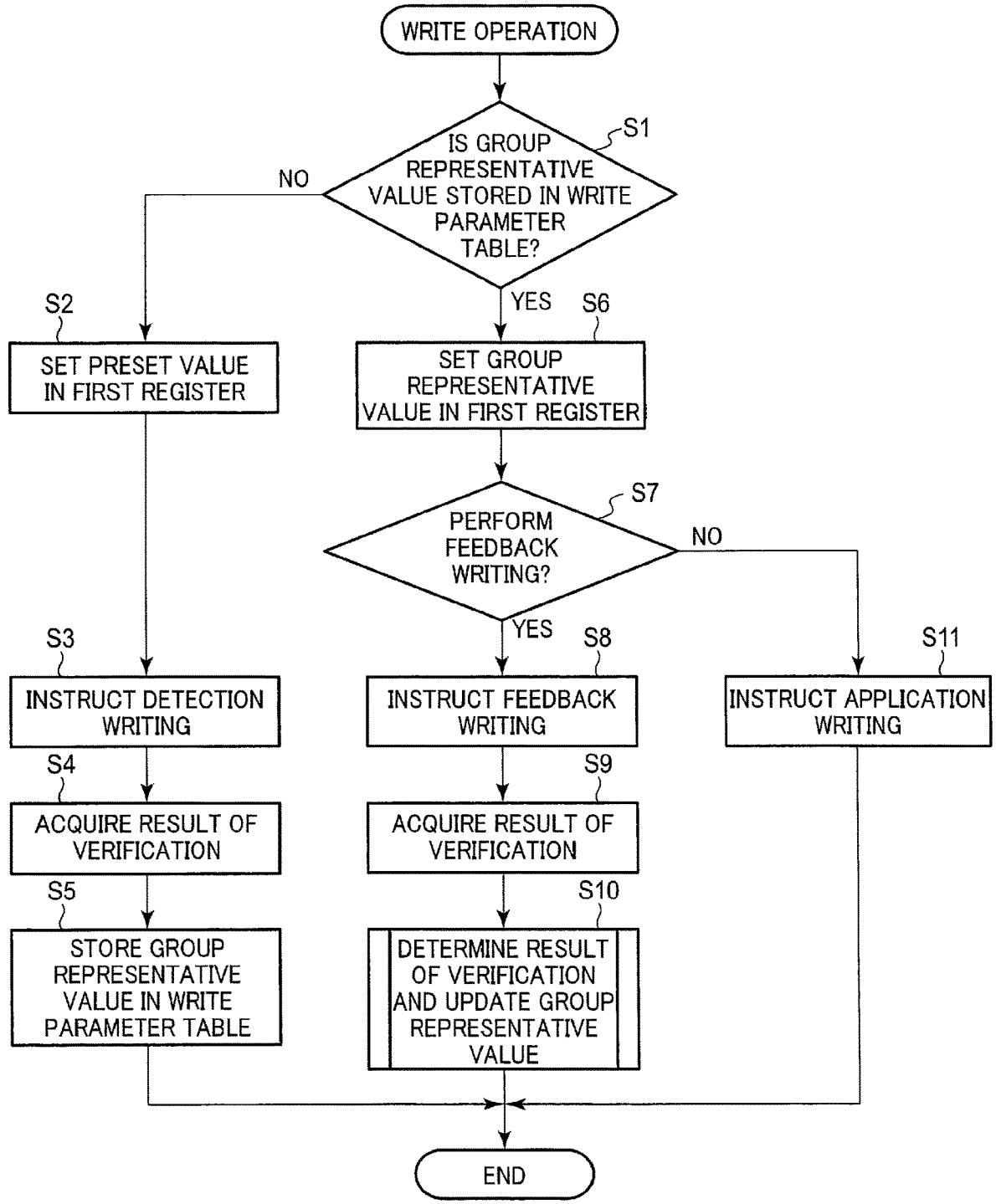
F I G. 8

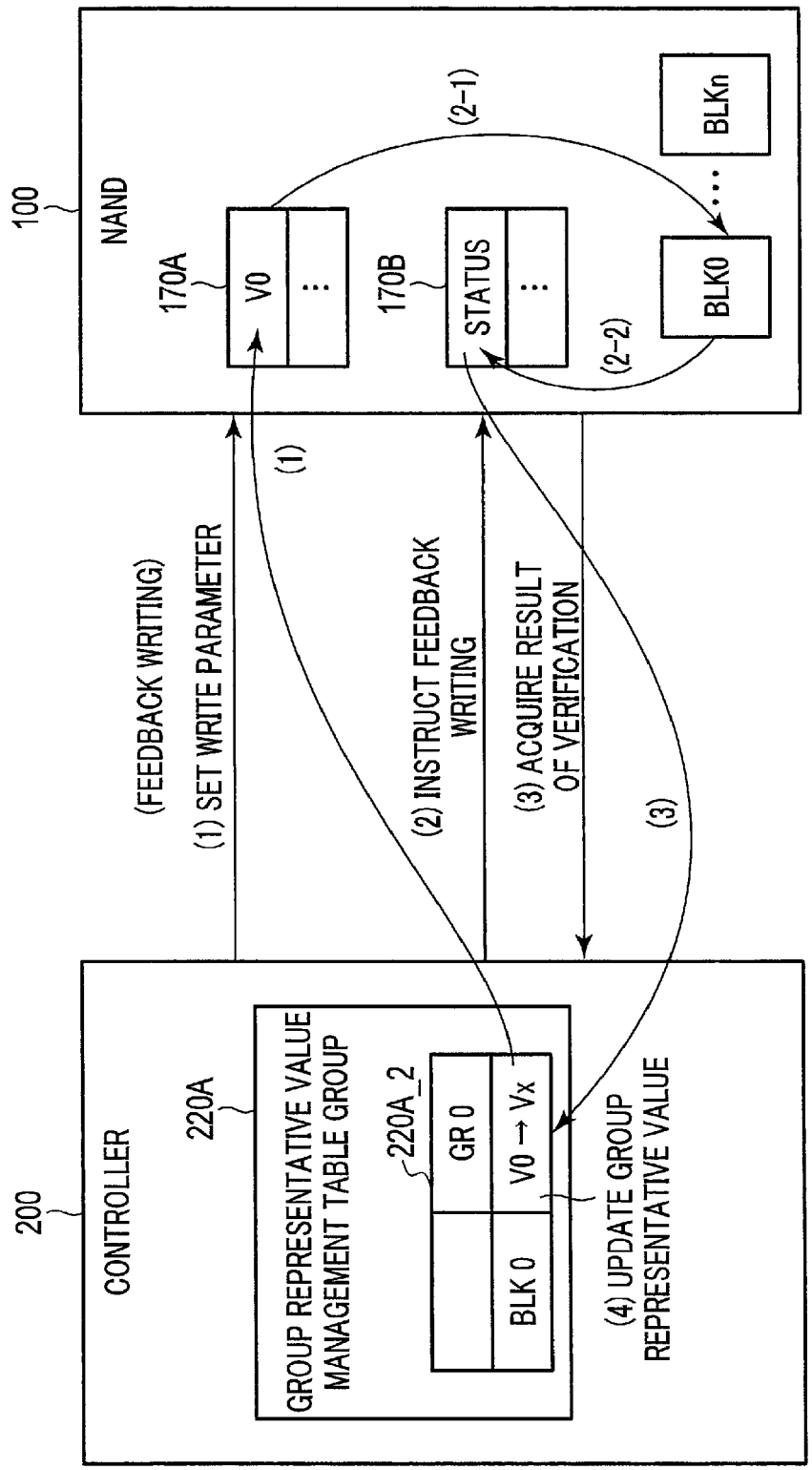
F I G. 10

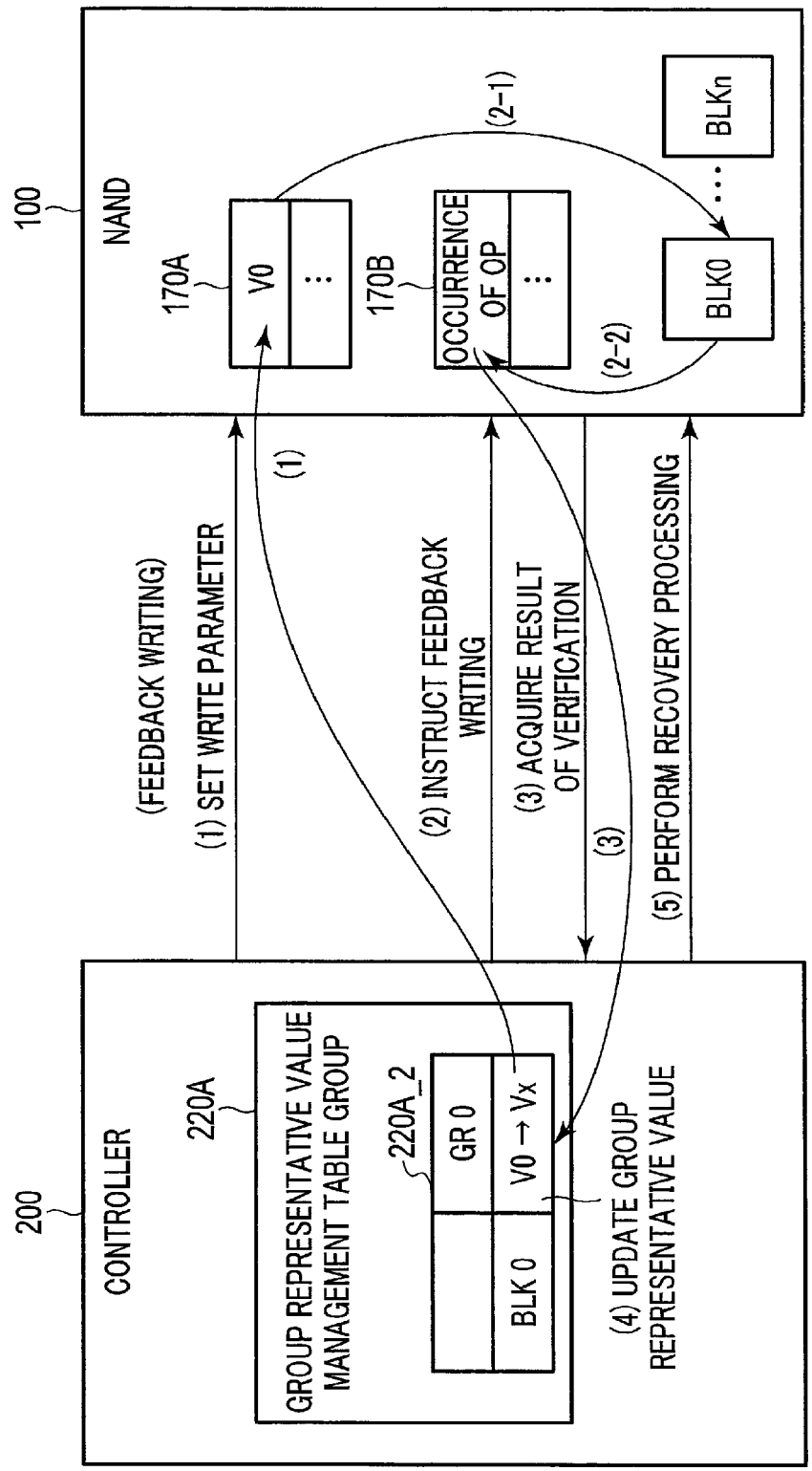
F I G. 11

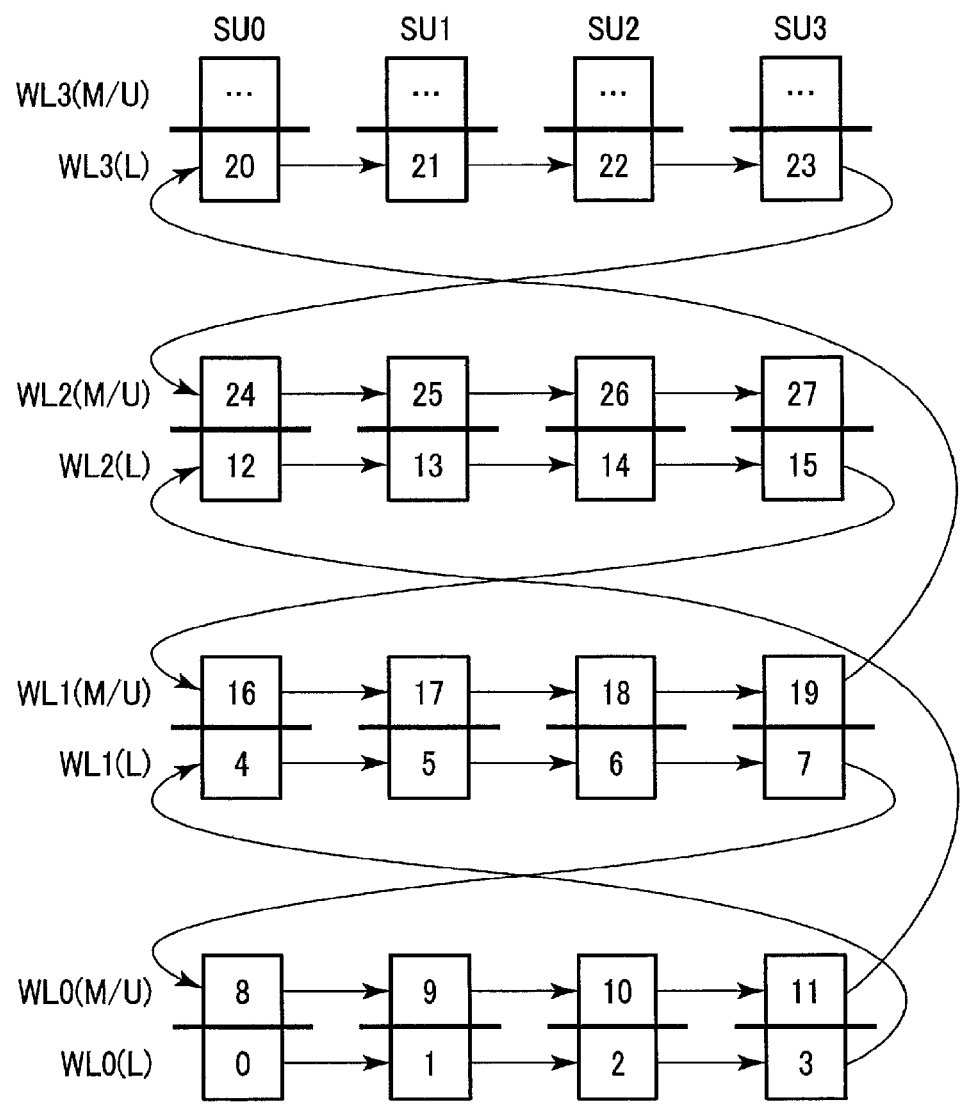
F I G. 12

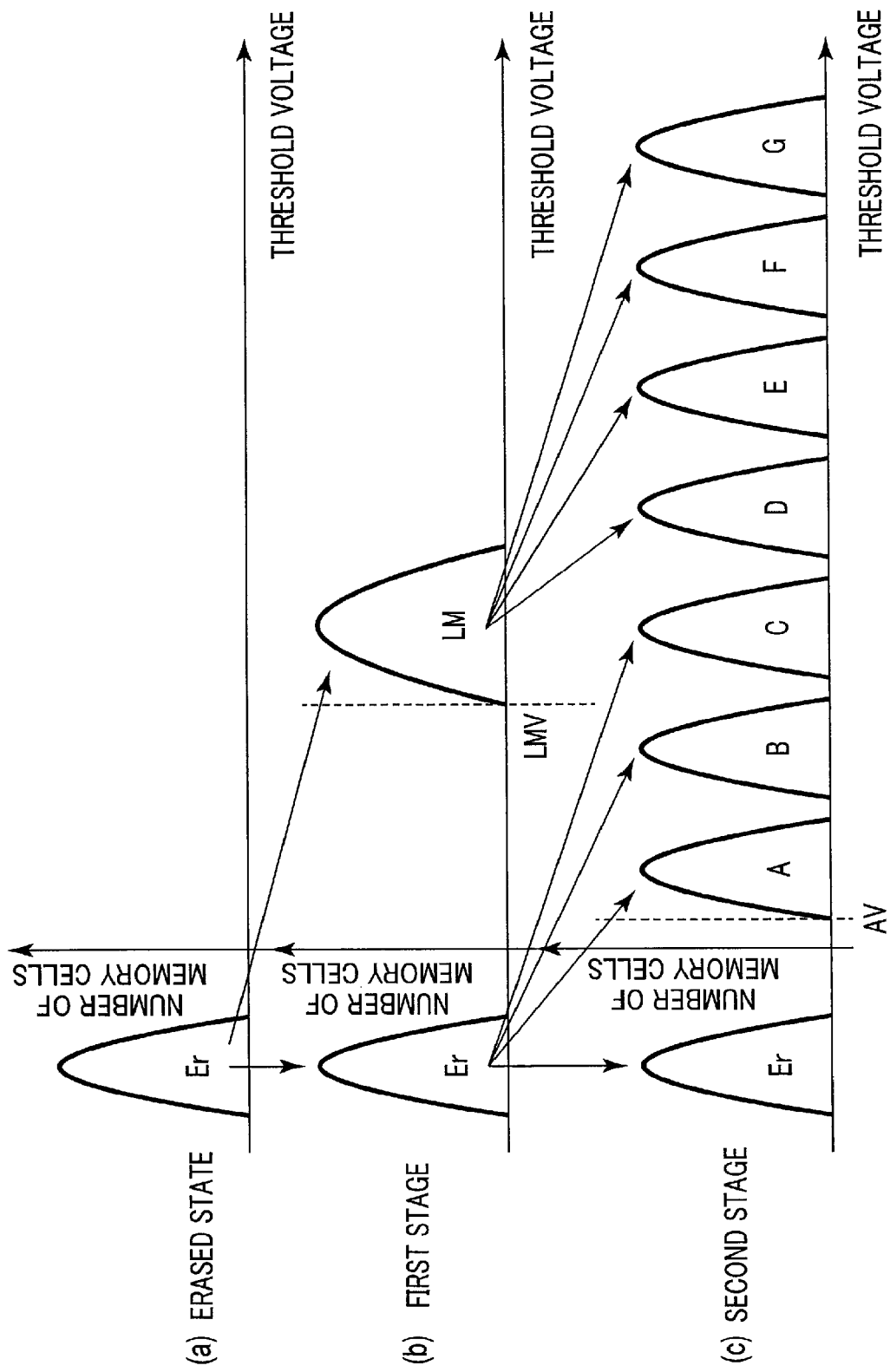
F I G. 13

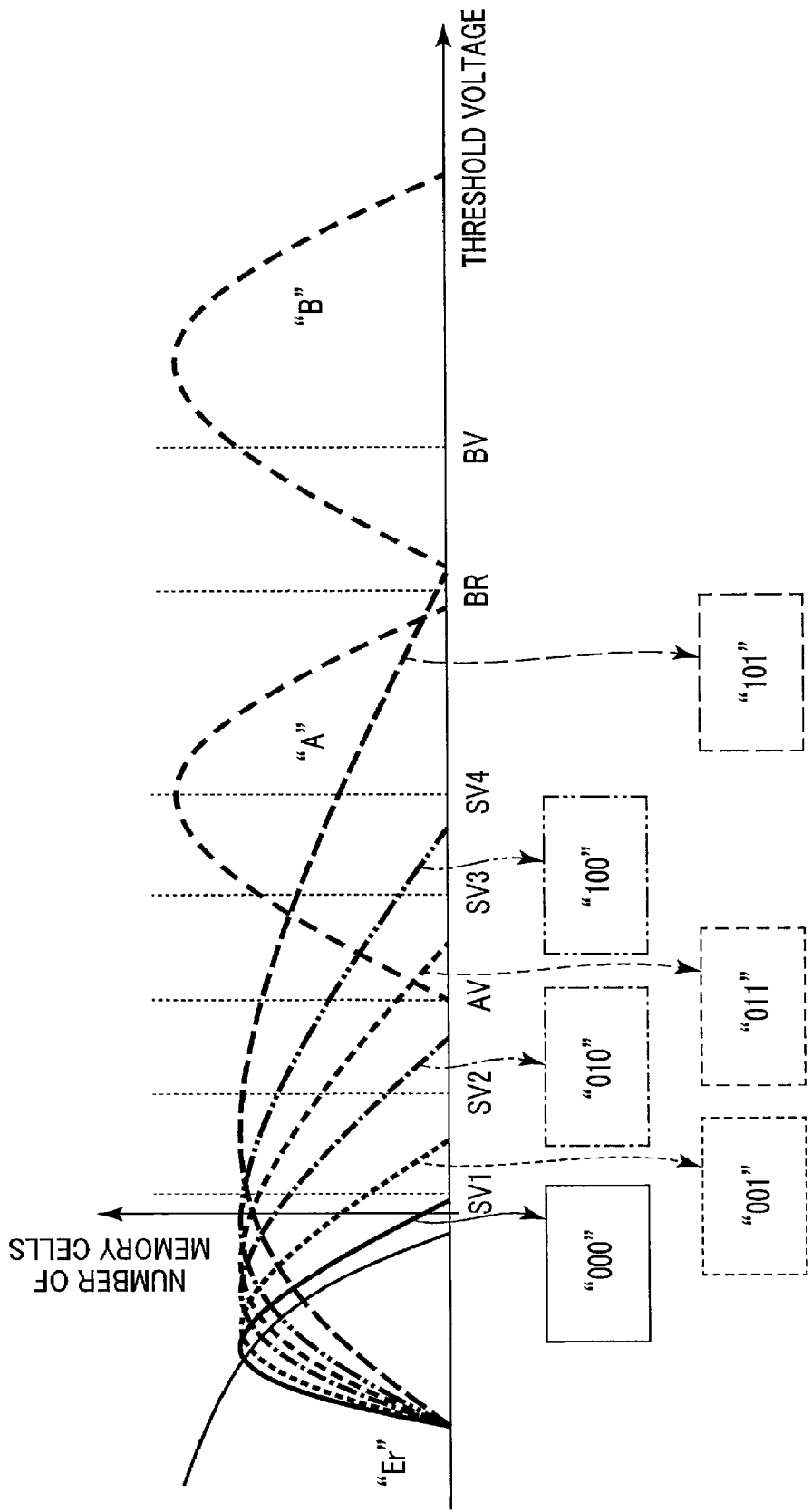
F I G. 15B

| RESULT OF VERIFICATION | UPDATE GROUP REPRESENTATIVE VALUE WITH | OVER PROGRAMMING (OP) OCCURS? |
|---|---|---|
| DOES NOT EXCEED SV1 | VPGM+2×ΔV | NO |
| EXCEEDS SV1 AND DOES NOT EXCEED SV2 | VPGM+ΔV | NO |
| EXCEEDS SV2 AND DOES NOT EXCEED AV | NO UPDATING | NO |
| EXCEEDS AV AND DOES NOT EXCEED SV3 | VPGM−ΔV | NO |
| EXCEEDS SV3 AND DOES NOT EXCEED SV4 | VPGM−2×ΔV | NO |
| EXCEEDS SV4 | VPGM−3×ΔV | THERE IS POSSIBILITY OF OP OCCURRENCE SUSPECTED, SO RECOVERY PROCESSING PERFORMED |

F I G. 16

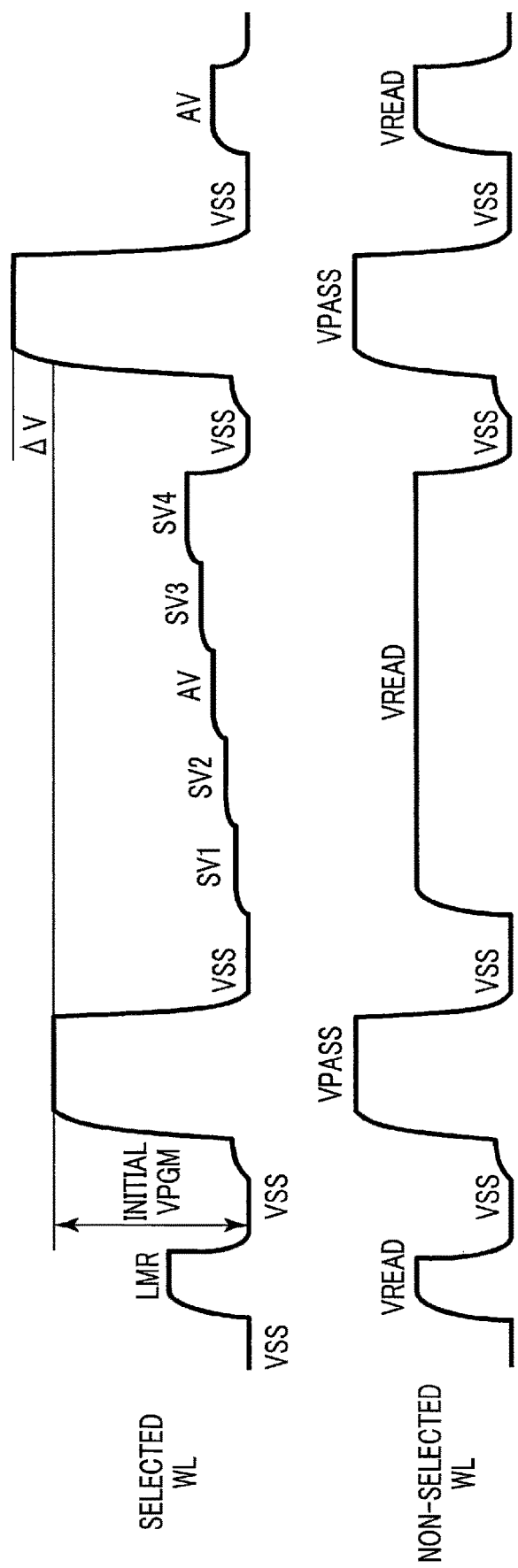
F I G. 18

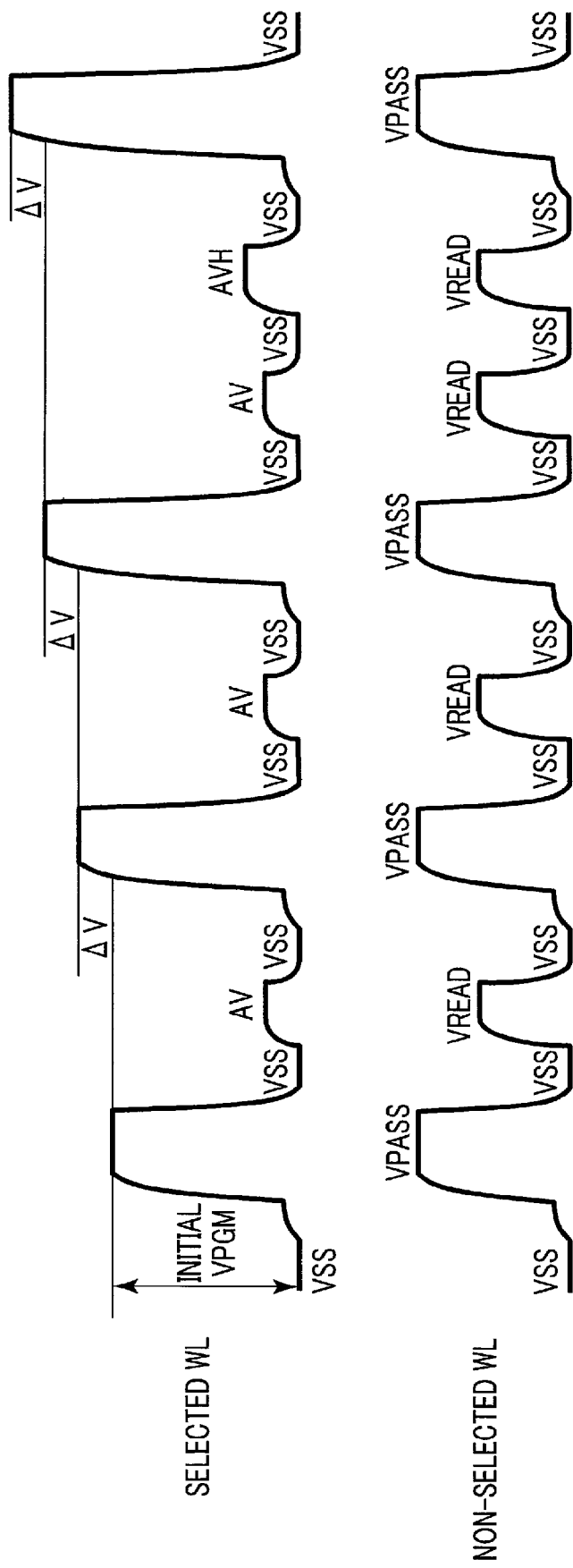
F I G. 19

| | NUMBER OF LOOPS IN WHICH MEMORY CELLS HAVE PASSED AV | OCCURRENCE OF OP WHEN MEMORY CELLS HAVE PASSED AV (1: OCCURRED 0: NOT OCCURRED) | OCCURRENCE OF OP | NUMBER OF LOOPS IN WHICH MEMORY CELLS HAVE PASSED AV | | | | | | |
|---|---|---|---|---|---|---|---|---|---|---|
| | | | [7] | [6] | [5] | [4] | [3] | [2] | [1] | [0] |
| (a) | 1 | 1 | 1 | 0 | 0 | 0 | 0 | 0 | 0 | 1 |
| (b) | 1 | 0 | 0 | 0 | 0 | 0 | 0 | 0 | 0 | 1 |
| (c) | 2 | 1 | 1 | 0 | 0 | 0 | 0 | 0 | 1 | 0 |
| (d) | 2 | 0 | 0 | 0 | 0 | 0 | 0 | 0 | 1 | 0 |
| (e) | 3 | 1 | 1 | 0 | 0 | 0 | 0 | 0 | 1 | 1 |
| (f) | 3 | 0 | 0 | 0 | 0 | 0 | 0 | 0 | 1 | 1 |
| (g) | 4 | 1 | 1 | 0 | 0 | 0 | 0 | 1 | 0 | 0 |
| (h) | 4 | 0 | 0 | 0 | 0 | 0 | 0 | 1 | 0 | 0 |

| | RESULT OF VERIFICATION | | UPDATE GROUP REPRESENTATIVE VALUE WITH | PERFORM RECOVERY PROCESSING |
|---|---|---|---|---|
| | NUMBER OF LOOPS IN WHICH MEMORY CELLS HAVE PASSED AV | OCCURRENCE OF OP WHEN MEMORY CELLS HAVEPASSED AV | | |
| (a) | 1 | 1 | VPGM$-3 \times \Delta$V | YES |
| (b) | 1 | 0 | VPGM$-2 \times \Delta$V | NO |
| (c) | 2 | 1 | VPGM$-\Delta$V | YES |
| (d) | 2 | 0 | NO UPDATING | NO |
| (e) | 3 | 1 | VPGM$+\Delta$V | YES |
| (f) | 3 | 0 | VPGM$+\Delta$V | NO |
| (g) | 4 | 1 | VPGM$+2 \times \Delta$V | YES |
| (h) | 4 | 0 | VPGM$+2 \times \Delta$V | NO |

F I G. 22

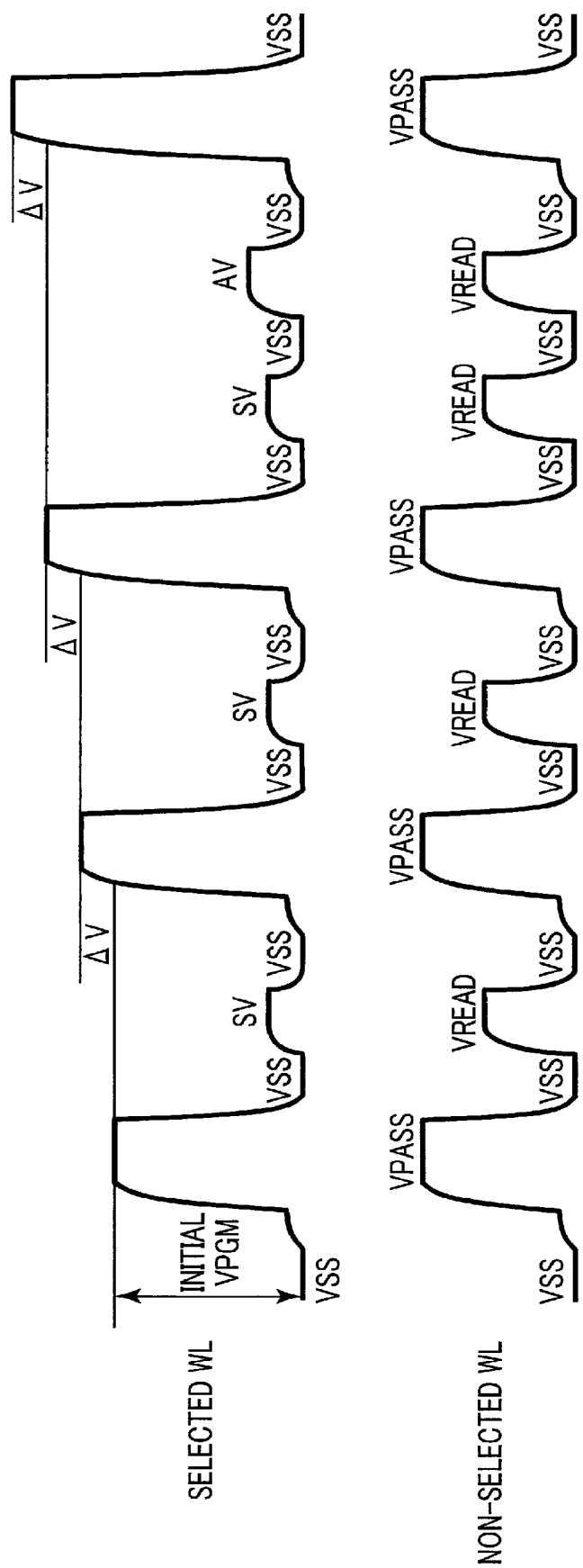
F I G. 25

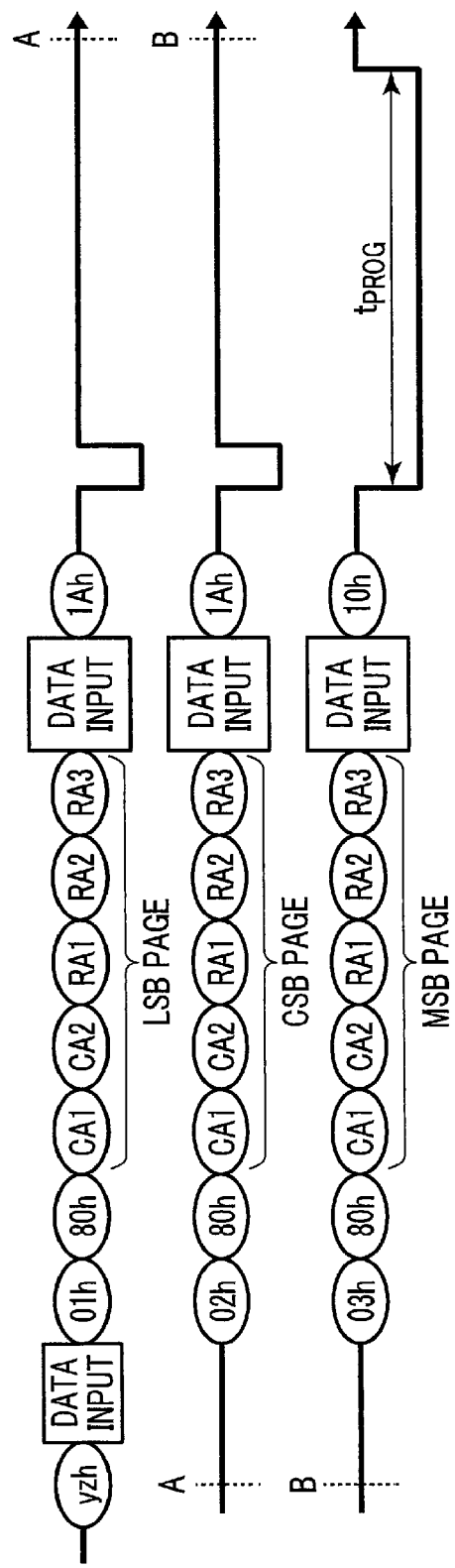
F I G. 30

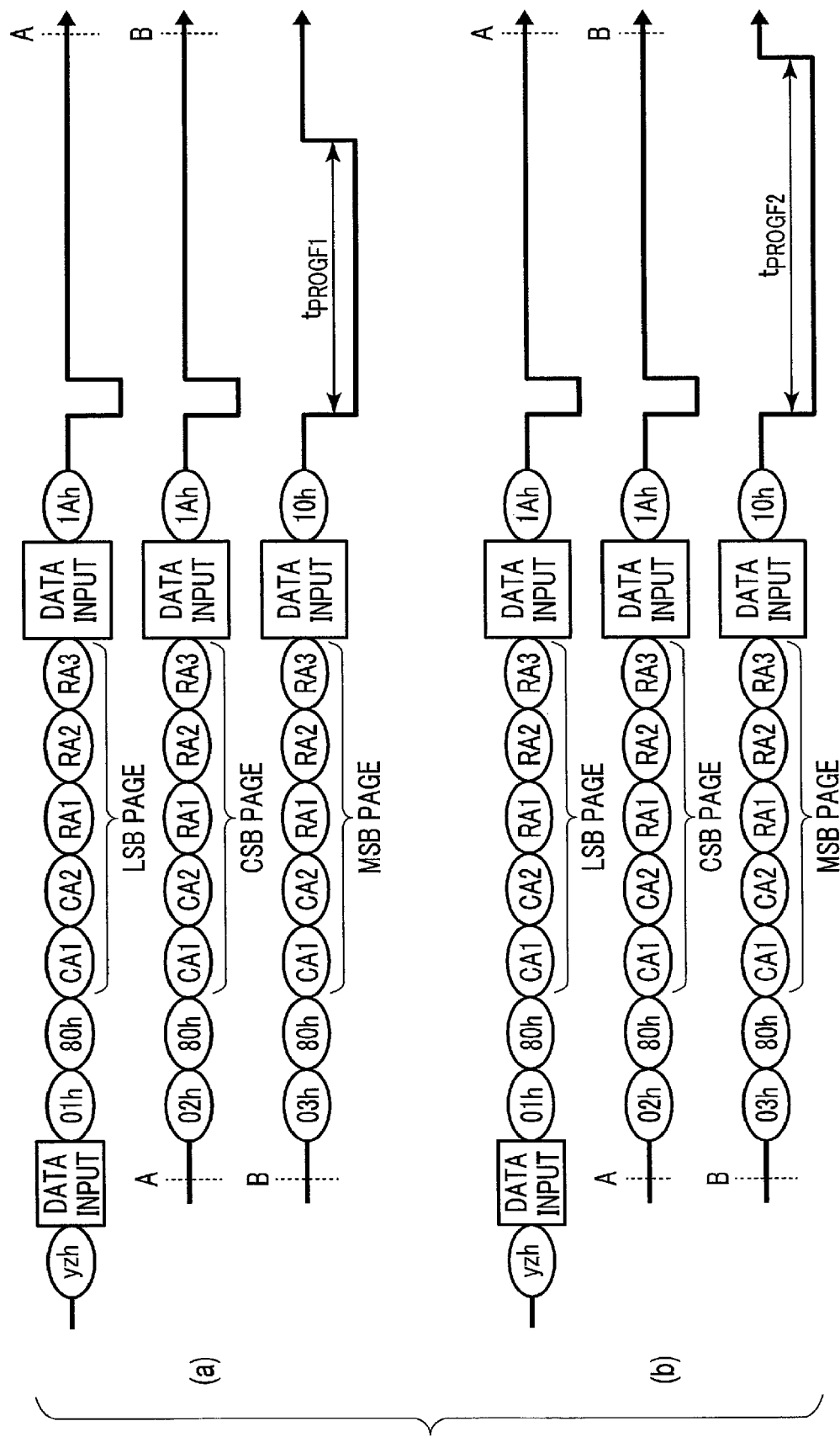
F I G. 32

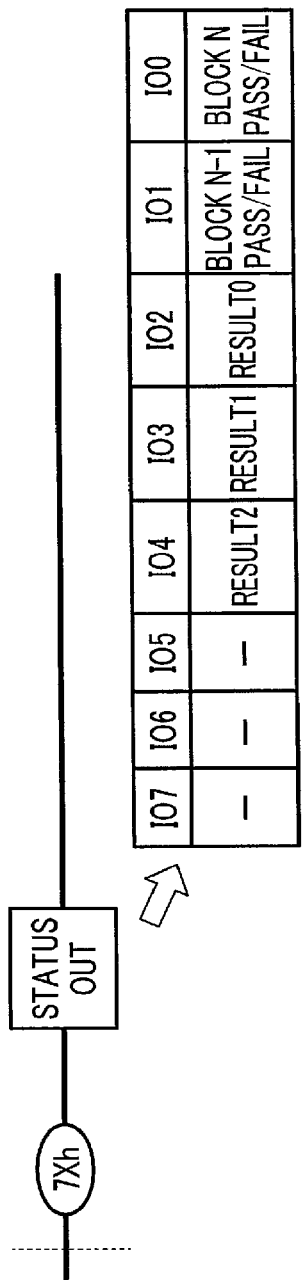
F I G. 34

MEMORY SYSTEM AND NON-VOLATILE SEMICONDUCTOR MEMORY

CROSS-REFERENCE TO RELATED APPLICATIONS

This application is based upon and claims the benefit of priority from the Japanese Patent Application No. 2018-128320, filed Jul. 5, 2018; the entire contents of which are incorporated herein by reference.

FIELD

Embodiments described herein relate generally to a memory system and a non-volatile semiconductor memory.

BACKGROUND

A NAND flash memory, in which memory cells are two-dimensionally or three-dimensionally arranged, is known as a non-volatile semiconductor memory. A memory system includes a NAND flash memory and a controller that controls the NAND flash memory.

BRIEF DESCRIPTION OF THE DRAWINGS

FIG. 4 is a drawing illustrating threshold voltage distributions and pages of memory cell transistors.

FIG. 5 is a drawing showing write voltages in a detection writing and an application writing, and threshold voltages of memory cell transistors.

FIG. 7A is a drawing showing a group definition table stored in the controller.

FIG. 7B is a drawing showing a group write parameter table stored in the controller.

FIG. 7C is a drawing showing a feedback writing cycle definition table stored in the controller.

FIG. 7D is a drawing showing a feedback writing schedule table stored in the controller.

FIG. 8 is a flowchart showing a write operation according to embodiments.

FIG. 10 is a drawing showing an interface between a controller and a NAND flash memory in a feedback writing.

FIG. 11 is a drawing showing an interface between a controller and a NAND flash memory in a feedback writing.

FIG. 12 is a drawing showing an order of writing in a case where data is written into a three-dimensional NAND flash memory by two-stage programming.

FIG. 13 is a drawing showing shifts of threshold voltage distributions in the two-stage programming.

FIGS. 15A and 15B are a drawing showing threshold voltage distributions of memory cells and results of verification as a result of the program operation.

FIG. 16 is a drawing showing relationships between "results of verification in the feedback writing" and "updates of group representative values and occurrence of over-programming".

FIG. 18 is a drawing showing word line voltages in a program operation and a verify operation in a feedback writing in an embodiment (a third example).

FIG. 19 is a drawing showing word line voltages in a program operation and a verify operation for a feedback writing in an embodiment (a fourth example).

FIG. 22 is a drawing showing updates of group representative values based on the results of verification obtained from the feedback writing, and necessity of recovery processing.

FIG. 25 is a drawing showing word line voltages in a program operation and a verify operation in a feedback writing in an embodiment (a seventh example).

FIG. 30 is a drawing showing a command sequence instructing a write operation based on full-sequence programming in embodiments.

FIG. 32 is a drawing showing a command sequence instructing a write operation based on foggy-fine programming in embodiments.

FIG. 34 shows an example of status information that is output in response to a status read command.

DETAILED DESCRIPTION

In general, according to one embodiment, a memory system including a non-volatile semiconductor memory that includes a memory cell and a controller having a memory storing a write parameter used in a write operation to the memory cell. The controller instructs the non-volatile semiconductor memory to perform the write operation to the memory cell using the write parameter, receives, from the non-volatile semiconductor memory, a result of checking of the write parameter which is obtained in the write operation and updates the write parameter stored in the memory on the basis of the result of checking of the write parameter.

Hereinafter, the embodiments will be described with reference to the drawings. In the description, constituent elements having the same functions and configurations will be denoted by the same reference symbols. Each of the following embodiments is shown to present an example of a device and a method for carrying out the technical concept of the embodiment, and it is to be understood that the materials, the shapes, the structures, the arrangements, and the like of the constituent components are not limited to those shown later.

Each of the function blocks can be implemented in the form of hardware, computer software, or a combination thereof. The function blocks do not have to be categorized as in the later example. For example, part of the functions may be implemented by a function block other than the exemplary function blocks. In addition, the exemplary function blocks may be further divided into functional sub-blocks. Hereinafter, a three-dimensionally stacked type NAND flash memory in which memory cell transistors are stacked above a semiconductor substrate will be described as an example of the non-volatile semiconductor memory device.

1. Embodiments

A memory system according to embodiments will be described. Hereinafter, a NAND flash memory will be described as an example of a non-volatile semiconductor memory.

1.1. Configuration

1.1.1 Overall Configuration of Memory System

Figure 1:
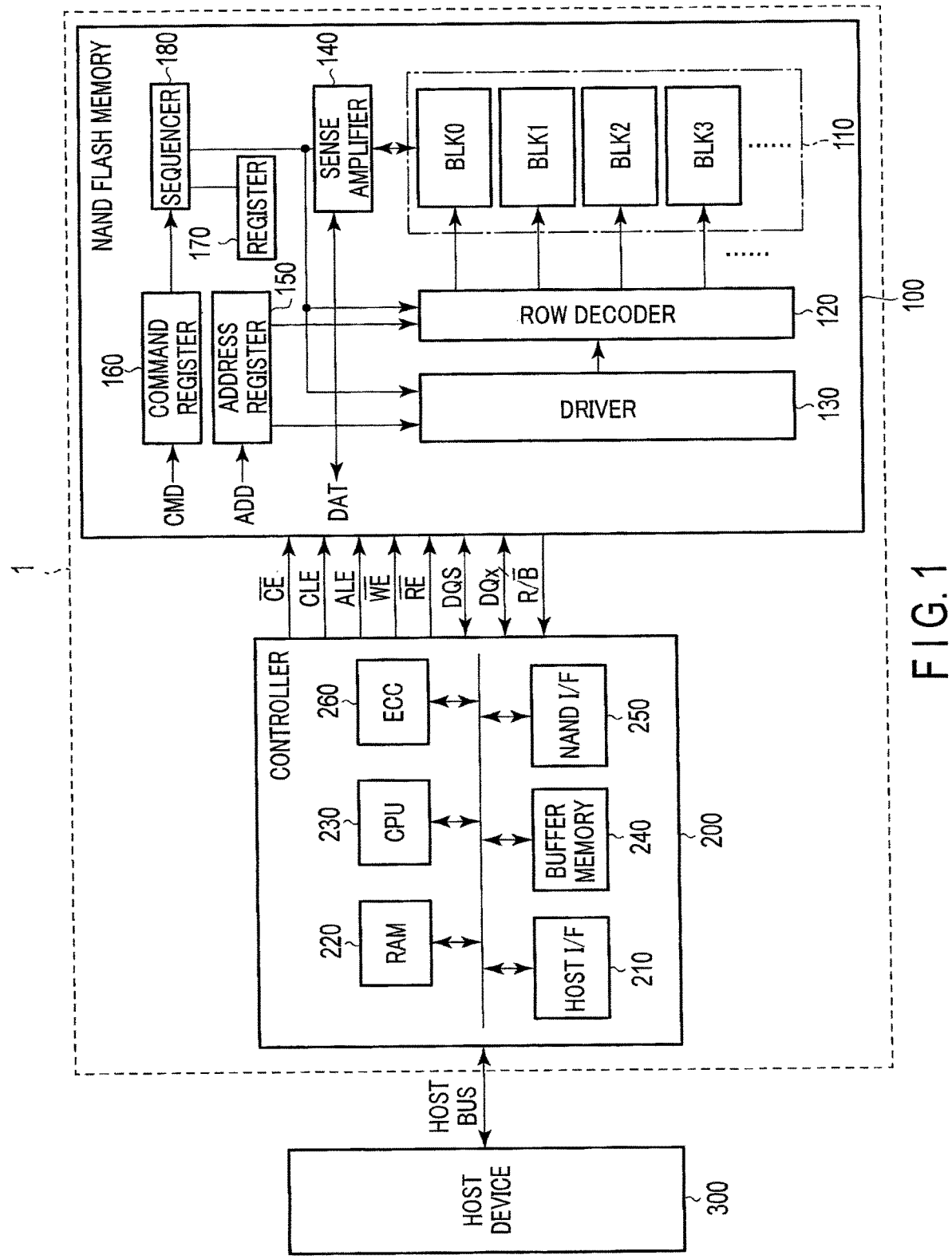
FIG. 1 is a block diagram illustrating an overall configuration of a memory system according to embodiments.

First, an overall configuration of a memory system according to the embodiments will be described with reference to FIG. 1, which is a block diagram showing an overall configuration of the memory system according to the embodiments. The memory system 1 includes a NAND flash memory 100 and a controller 200. The NAND flash memory 100 and the controller 200 may form one semiconductor device in combination, for example. The semiconductor device is, for example, a memory card such as an SD™ card, or a solid state drive (SSD). The controller 200 may be a system-on-a-chip (SoC) for example.

The NAND flash memory 100 includes a plurality of memory cells to store data in a non-volatile manner.

The controller 200 is coupled to the NAND flash memory 100 via a NAND bus and is coupled to a host device 300 via a host bus. The controller 200 controls the NAND flash memory 100, and accesses the NAND flash memory 100 in response to an instruction received from the host device 300.

The host device 300 is, for example, a digital camera or a personal computer for example, and the host bus is an SD™ interface-compatible bus for example. The NAND bus performs signal transmission/reception compliant with a NAND interface. The NAND bus includes a bus that communicates, for example, a chip enable signal /CE, a command latch enable signal CLE, an address latch enable signal ALE, a write enable signal /WE, a read enable signal /RE, a data strobe signal DQS, an I/O signal DQx (DQ0 through DQ7), and a ready/busy signal R/B. The I/O signal DQx communicates a command, an address, and data, etc.

1.1.2 Configuration of Controller

Next, a configuration of the controller 200 will be described with reference to FIG. 1. The controller 200 includes a host interface (I/F) circuit 210, a built-in memory (RAM) 220, a processor (CPU) 230, a buffer memory 240, a NAND interface (I/F) circuit 250, and an error checking and correcting (ECC) circuit 260.

The host interface circuit 210 is coupled to the host device 300 via the host bus. The host interface circuit 210 transfers instructions and data received from the host device 300 to the processor 230 and the buffer memory 240, respectively. The host interface circuit 210 also transfers data in the buffer memory 240 to the host device 300 in response to an instruction from the processor 230.

The processor 230 controls the operation of the entire controller 200. For example, upon receipt of a write instruction from the host device 300, the processor 230 issues, in response thereto, a write instruction to the NAND interface circuit 250. A similar process is performed when reading and erasing. The processor 230 also executes various processes, such as wear leveling, for managing the NAND flash memory 100. The operation of the controller 200, which will be described hereinafter, may be realized by the processor 230 executing software (or firmware) or by hardware.

The NAND interface circuit 250 is coupled to the NAND flash memory 100 via the NAND bus to communicate with the NAND flash memory 100. The NAND interface circuit 250 transmits various signals to and receives various signals from the NAND flash memory 100 based on instructions received from the processor 230.

The buffer memory 240 temporarily stores write data and read data. The buffer memory 240 may be comprised of a DRAM or an SRAM.

The built-in memory 220 is, for example, a semiconductor memory, such as a DRAM or an SRAM, and is used as a work area of the processor 230. The built-in memory 220 stores firmware for managing the NAND flash memory 100, and various management tables and the like.

The ECC circuit 260 performs error detection and error correction processes on data stored in the NAND flash memory 100. Namely, the ECC circuit 260 generates an error correction code and adds the error correction code to write data in data writing, and decodes the error correction code in read data in data reading.

1.1.3 Configuration of NAND Flash Memory

1.1.3.1 Overall Configuration of NAND Flash Memory

Next, a configuration of the NAND flash memory 100 will be described. As shown in FIG. 1, the NAND flash memory 100 includes a memory cell array 110, a row decoder 120, a driver 130, a sense amplifier 140, an address register 150, a command register 160, a register 170, and a sequencer 180.

The memory cell array 110 includes a plurality of blocks BLK (BLK0, BLK1, BLK2, BLK3 . . . ), each including a plurality of non-volatile memory cells each associated with a row and a column. The memory cell array 110 stores data provided from the controller 200.

The row decoder 120 selects one of the blocks BLK, and selects a word line in the selected block BLK.

The driver 130 supplies a voltage to the selected block BLK via the row decoder 120.

In reading data, the sense amplifier 140 senses data DAT that is read from the memory cell array 110, and performs a necessary amplification. Then, the sense amplifier 140 outputs the data DAT to the controller 200. In writing data, the sense amplifier 140 transfers write data DAT received from the controller 200 to the memory cell array 110.

The address register 150 latches an address ADD received from the controller 200. The command register 160 latches a command CMD received from the controller 200.

The register 170 includes a plurality of registers. The plurality of registers included in the register 170 store write parameters and results of verification, for example. The write parameters and results of verification will be described later.

The sequencer 180 controls operations of the NAND flash memory 100 based on various information stored in the address register 150, the command register 160, and the register 170.

1.1.3.2 Configuration of Blocks BLK

Figure 2:
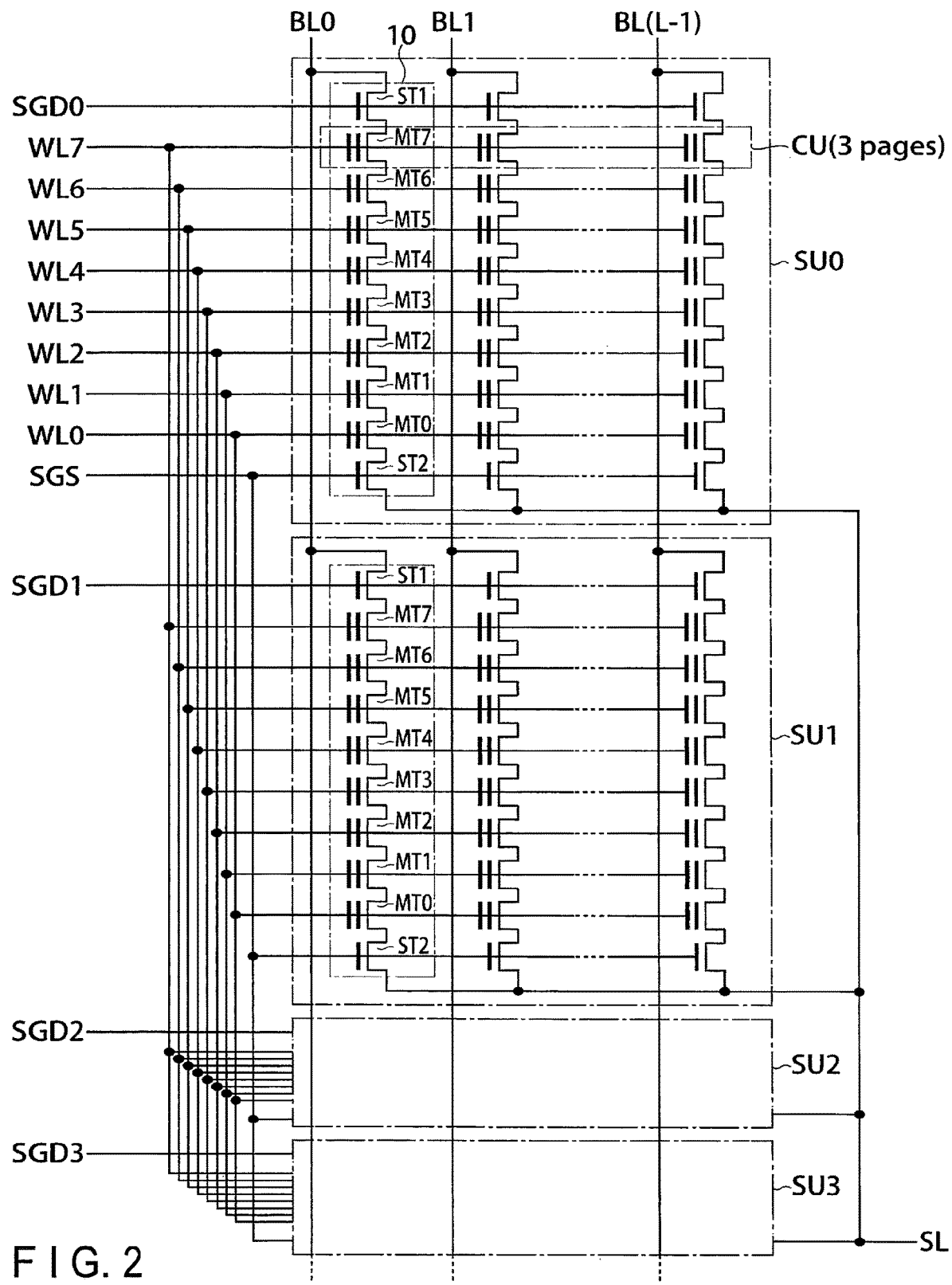
FIG. 2 is a circuit diagram of a block included in a memory cell array in embodiments.

Next, a configuration of the blocks BLK will be described with reference to FIG. 2, which is a circuit diagram of a block BLK included in the memory cell array 110. As shown in FIG. 2, a block BLK includes, for example, four string units SU (SU0 to SU3). Each string unit SU includes a plurality of NAND strings 10.

Each NAND string 10 includes eight memory cell transistors (MT0 to MT7) and select transistors ST1 and ST2, for example. Each memory cell transistor (hereinafter, may be referred to as a memory cell) MT is provided with a control gate and a charge storage layer, and stores data in a non-volatile manner. The memory cell transistors MT are coupled in series between the source of select transistor ST1 and the drain of select transistor ST2.

The gates of select transistors ST1 in string units SU0 to SU3 are coupled to select gate lines SGD0 through SGD3, respectively. On the other hand, the gates of select transistors ST2 in string units SU0 to SU3 are coupled in common to, for example, select gate line SGS. The gates of select transistors ST2 may be coupled to respective different select gate lines SGS0 through SGS3. The control gates of memory cell transistors MT0 to MT7 in each block BLK are respectively coupled to word lines WL0 through WL7.

In the memory cell array 110, bit lines BL (BL0 to BL(L−1), L is a natural number equal to or greater than 2) are shared among a plurality of blocks BLK. In a plurality of string units SU in each block BLK, the drains of the select transistor ST1 of the NAND strings 10 in the same column are coupled to each bit line BL in common. In other words, the NAND strings 10 in a plurality of string units SU in the same column are coupled in common to a bit line BL. Moreover, the sources of the plurality of select transistors ST2 are coupled in common to a source line SL. In other words, each string unit SU includes a plurality of NAND strings 10 coupled to different bit lines BL and coupled to the same select gate line SGD.

Each block BLK includes a plurality of string units SU sharing the word lines WL.

Figure 3:
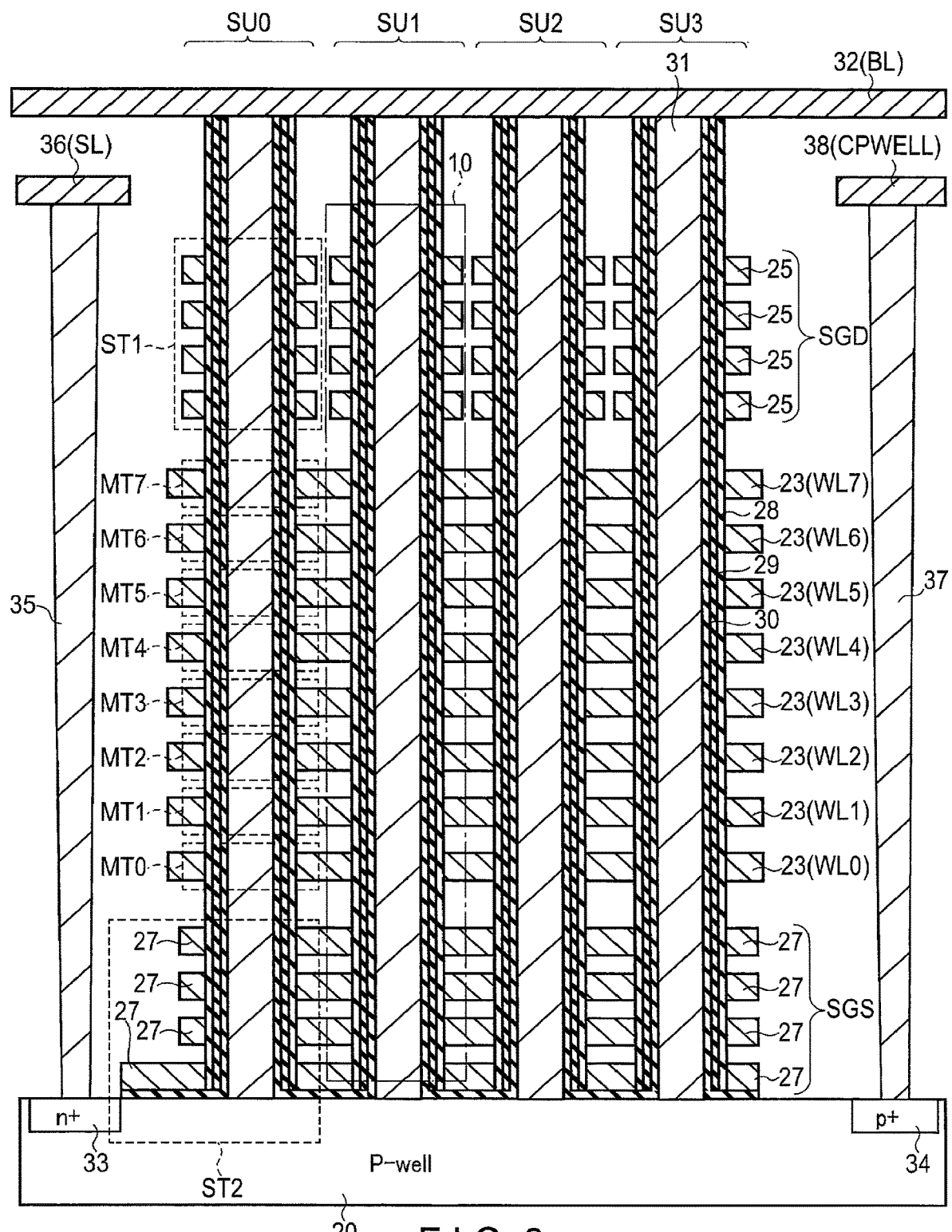
FIG. 3 is a cross-sectional view of a part of a block.

FIG. 3 is a cross-sectional view of a part of a block BLK. As shown in FIG. 3, a plurality of NAND strings 10 are formed above a p-well region 20. Specifically, for example, four layers of interconnect layers 27 functioning as select gate lines SGS, eight layers of interconnect layers 23 respectively functioning as word lines WL0 through WL7, and for example, four layers of interconnect layers 25 functioning as select gate lines SGD are sequentially stacked above the p-well region 20. Insulating films (not shown) are formed between the stacked interconnect layers.

A pillar-shaped conductor 31 extending through the interconnect layers 25, 23, and 27 to reach the p-well region 20 is formed. On the side surface of the conductive layer 31, a gate insulating film 30, a charge storage layer (insulating film) 29, and a block insulating film 28 are formed in this order. The memory cell transistors MT and select transistors ST1 and ST2 are thereby formed. The conductor 31 functions as a current path of the NAND string 10, and is used as a region in which a channel of each transistor is formed. The upper end of the conductor 31 is coupled to a metal interconnect layer 32 that functions as a bit line BL.

In a surface region of the p-well region 20, an $n^+$-type impurity diffusion layer 33 is formed. A contact plug 35 is formed on the diffusion layer 33, and is coupled to a metal interconnect layer 36 that functions as a source line SL. In the surface region of the p-well region 20, a $p^+$-type impurity diffusion layer 34 is also formed. A contact plug 37 is formed on the diffusion layer 34, and is coupled to a metal interconnect layer 38 that functions as a well interconnect CPWELL. The well interconnect CPWELL is used to apply a potential to the conductor 31 via the p-well region 20.

A plurality of configurations as described above are arranged in the direction perpendicular to the sheet on which FIG. 3 is shown (the depth direction), and a set of a plurality of NAND strings 10 aligned in the depth direction form a string unit SU.

The memory cell array 110 may have other configurations. The configuration of the memory cell array 110 is disclosed in, for example, U.S. patent application Ser. No. 12/407,403, titled "THREE DIMENSIONAL STACKED NONVOLATILE SEMICONDUCTOR MEMORY" and filed on Mar. 19, 2009. The same is also disclosed in U.S. patent application Ser. No. 12/406,524, titled "THREE DIMENSIONAL STACKED NONVOLATILE SEMICONDUCTOR MEMORY" and filed on Mar. 18, 2009; U.S. patent application Ser. No. 12/679,991, titled "NON-VOLATILE SEMICONDUCTOR STORAGE DEVICE AND METHOD OF MANUFACTURING THE SAME" and filed on Mar. 25, 2010; and U.S. patent application Ser. No. 12/532,030, titled "SEMICONDUCTOR MEMORY AND METHOD FOR MANUFACTURING SAME" and filed on Mar. 23, 2009. The entire contents of these patent applications are incorporated herein by reference.

Data erasing can be performed in a unit of a block BLK, or smaller units. A data erasing method is disclosed in U.S. patent application Ser. No. 13/235,389, titled "NONVOLATILE SEMICONDUCTOR MEMORY DEVICE" and filed on Sep. 18, 2011, for example. The same is also disclosed in U.S. patent application Ser. No. 12/694,690, titled "NON-VOLATILE SEMICONDUCTOR STORAGE DEVICE" and filed on Jan. 27, 2010. The same is further disclosed in U.S. patent application Ser. No. 13/483,610, titled "NON-VOLATILE SEMICONDUCTOR MEMORY DEVICE AND DATA ERASE METHOD THEREOF" and filed on May 30, 2012. The entire contents of those patent applications are incorporated herein by reference.

1.1.3.3 Threshold Voltages Distributions of Memory Cell Transistors

FIG. 4 shows data to be stored in the memory transistors MT and threshold voltage distributions thereof according to the embodiments. Herein, a triple-level cell (TLC) in which the number of bits per cell is three will be described.

As illustrated in FIG. 4, each memory cell transistor MT may store for example 3-bit data in accordance with a threshold voltage thereof. The 3-bit data is, for example, "111", "110", "100", "000", "010", "011", "001", and "101", in order from lower to higher threshold voltages. The threshold voltage states of the memory cells storing those data are, from lower to higher, for example, an "Er" state (e.g., lower than voltage VA), an "A" state (e.g., equal to or higher than the voltage VA and lower than voltage VB, and VA<VB), a "B" state (e.g., equal to or higher than the voltage VB and lower than voltage VC, and VB<VC), a "C" state (e.g., equal to or higher than the voltage VC and lower than voltage VD, and VC<VD), a "D" state (e.g., equal to or higher than the voltage VD and lower than voltage VE, and VD<VE), an "E" state (e.g., equal to or higher than the voltage VE and lower than voltage VF, and VE<VF), an "F" state (e.g., equal to or higher than the voltage VF and lower than voltage VG, and VF<VG), and a "G" state (e.g., equal to or higher than the voltage VG and lower than voltage VREAD, and VG<VREAD). The relationship between the 3-bit data and the threshold voltages is not limited to the above, and the relationship can be selected as appropriate.

The 3-bit data stored in each memory cell transistor MT may be called a lower bit, a middle bit, and an upper bit, from lower to higher bits. In one string unit SU, a set of lower bits stored in a cell unit CU that includes a plurality of memory cells coupled to the same word line may be referred to as a lower page, a set of middle bits may be referred to as a middle page, and a set of upper bits may be referred to as an upper page. In other words, 3 pages are allocated to each cell unit CU. Thus, "page" can be defined as a part of memory space formed by each cell unit CU.

Data writing and reading is performed in a unit of a page or a unit of a cell unit. In this example, since one string unit has eight word lines, each string unit SU has 3 pages×8, i.e., 24 pages. Furthermore, since each block BLK has four string units S17, each block has 24 pages×4, i.e., 96 pages.

1.2 Operations

1.2.1 Data Writing to NAND Flash Memory

A write operation includes a program operation (may be simply referred to as program) and a program verify operation.

The program operation is an operation for increasing a threshold voltage of a memory cell transistor MT by applying a write voltage (also referred to as a program voltage) to the gate electrode of the memory cell transistor MT and injecting a charge into the charge storage layer of the memory cell transistor MT.

The program verify operation is an operation for checking a change in the threshold voltage of the memory cell transistor MT that is caused by the application of the write voltage. In the program verify operation, it is determined whether or not a threshold voltage of a memory cell transistor reaches a predetermined voltage.

In a determination in program verification, when a threshold voltage of a memory cell transistor does not reach the predetermined voltage, in other words, when the program verification fails, a write voltage is increased by a constant voltage $\Delta V$ and a program operation is performed once again, and a program verify operation is then performed. A program operation and a program verify operation constitute a write loop, and this write loop is repeated until the memory cell transistor passes the program verification. The voltage $\Delta V$ as an increment is not limited to a constant voltage, but may be any varying voltage. Such a write operation performed with an increasing write voltage is called a step-up writing.

Herein, write characteristics when data is written into memory cells will be described. When memory cells are written into, ease of writing varies from one memory cell to another. For example, when a step-up writing is performed to a plurality of memory cells under the same conditions (e.g., using the same write parameter), the number of times the write loop is repeated until the writing is completed varies from a memory cell to another. A write parameter includes, for example, a write voltage, an incremental voltage LV, and a duration of time a write voltage is applied.

A degree of wear-out of a memory cell is increased every time erasure is performed, and a worn-out memory cell is easy to be written into. It is known that write characteristics of a memory cell are similar to those of memory cells in a same unit of write (i.e., a page), namely memory cells in the same word line, or to those of memory cells for which erasure is performed for the same number of times.

When writing data into memory cells, if a write parameter is determined based on an easiest-to-write memory cell, the number of times the write loop is performed for a hardest-to-write memory cell tends to increase. Conversely, if a write parameter is determined based on a hardest-to-write memory cell, an excessive writing, such as over-programming, tends to occur in an easiest-to-write memory cell, and unintended data might often be written into such a memory cell. Over-programming is a phenomenon in which data different from the intended data is written to the memory cell by injecting into the memory cell a charge larger than the charge corresponding to the intended data. Over-programming is caused by factors such as applying a write voltage higher than a write voltage required for writing intended data.

Smart verification has been proposed as a write scheme in light of the above-described tendency. Smart verification is a technique of reducing the number of times the write loop is repeated by dynamically adjusting and setting a write parameter based on write characteristics of each memory cell, instead of setting the same write parameter to all of the memory cells. Furthermore, the smart verification may be applied to a case where a write parameter is managed for a group of memory cells having similar write characteristics. For example, a plurality of memory cells coupled to one or more word lines are defined as a group.

In such an application of the smart verification, a detection writing and an application writing are performed. In the detection writing, a write parameter to a group of memory cells in which over-programming does not occur and with which a reduction in the number of write loops can be expected is searched. In the application writing, intended data is written to the group of memory cells with the reduced number of times the write loop is repeated using the write parameter searched by the detection writing. While performing the application writing for multiple times, the write parameter used in the application writing can be properly adjusted by performing the detection writing as appropriate. However, a time required for the detection writing is longer than a time required for the application writing. In other words, a time required for the application writing is shorter than a time required for the detection writing. Accordingly, in the smart verification, the detection writing or the application writing is performed in a unit of a group as appropriate, so that an average write time required for a write operation can be shortened.

A write parameter includes an increment voltage $\Delta V$ and a duration of time a write voltage is applied, besides a write voltage; however, the write parameter in the description hereafter is a write voltage used at the time of a program operation.

1.2.2 Detection Writing and Application Writing in Smart Verification

Next, the detection writing and the application writing in smart verification will be described in detail. There are two write schemes for memory cell transistors capable of storing data of multiple bits. One is a scheme, such as a full-sequence programming, in which multiple-bit data is written into memory cell transistors in a batch by one program command. The other is a scheme, such as a two-stage programming or a foggy-fine programming, in which multiple-bit data is written into memory cell transistors in multiple stages by a plurality of program commands. The two-stage programming is a scheme in which data is written into a lower order page such as lower page in a first stage and data is written into an higher order page such as upper and middle pages in a second stage. The foggy-fine programming is a scheme in which all data is roughly written into all pages (lower, upper, and middle pages) in a first stage and data is then finely written into the pages in a second stage. In any schemes, the detection writing and the application writing can be adopted.

In the following, the detection writing and the application writing will be described, using an example in which data corresponding to the "A" state is written into a memory cell which is at the "Er" state.

FIG. 5 shows a write voltage and a threshold voltage distribution of the memory cell transistors in a detection writing and an application writing. In FIG. 5, the pulse waveform in the top shows a change of a write voltage, and the waveforms in the bottom shows the threshold voltage distributions of the memory cell transistors when the write voltage is applied.

A write voltage VPGM is applied to a word line to perform a program operation, and a program verify operation is subsequently performed to determine the threshold voltages of the memory cell transistors. If the program verification fails, the write voltage VPGM is increased by a constant voltage ΔV. If the lower tail (i.e., the lowest threshold voltage) of a threshold voltage distribution of memory cell transistors exceeds a program verify voltage corresponding to write data, the memory cell transistors in this distribution pass the program verification and the write operation is finished. Specifically, the determination regarding whether memory cells pass/fail the program verification is made on a condition that the number of write target memory cells for which a threshold voltage is determined to be lower than the program verify voltage is equal to or less than a threshold. If the number of memory cells for which a threshold voltage is determined to be lower than the program verify voltage (the threshold value is not necessarily zero) is equal to or less than a threshold, it is determined that the memory cells pass the program verification.

A write operation of smart verification will be described with reference to FIG. 5. FIG. 5 illustrates a case in which data is written to the "A" state. In the detection writing of smart verification, a write loop including a program operation, a smart verify operation, and a program verify operation is repeated until at least an initial write voltage corresponding to write characteristics of a memory cell is detected. In other words, in the detection writing, a smart verify operation using a smart verify voltage SV is performed in addition to a program verify operation using a program verify voltage AV. In this smart verify operation using the smart verify voltage SV, an initial write voltage to be used in the application writing is detected.

In the following description, a case where a smart verify voltage SV is lower than a program verify voltage AV will be described.

In the smart verify operation, a write voltage, which is detected when the upper tail (i.e., highest threshold voltage) of a threshold voltage distribution of the memory cell transistors exceeds a smart verify voltage SV, is stored as an initial write voltage to be used in the application writing. An initial write voltage is stored on condition that the number of write target memory cells, of which threshold voltages are determined to exceed the smart verify voltage SV, is equal to or greater than a threshold value. After the initial write voltage is stored, in the detection writing in which the initial write voltage corresponding to the "A" state is detected, the smart verify operation is not performed. In this case, similarly to a conventional write operation, a write loop including a program operation and a program verify operation is repeated until the lower tail (the lowest threshold voltage) of the threshold voltage distribution of the memory cell transistors exceeds the program verify voltage AV.

As described above, in the detection writing, a write voltage at the time when threshold voltages of the predetermined number of memory cells exceed the smart verify voltage SV is detected. In the application writing, the detected write voltage is used as an initial write voltage, and the loop of the program operation and the program verify operation is repeated. By using the write voltage detected in the detection writing as the initial write voltage in the application writing, it is possible to reduce the number of times the write loop is repeated in the application writing, and to shorten a writing time.

In the detection writing, a preset write voltage VPGM, or a designated write voltage VPGM is used, and the write voltage is gradually increased so that a write parameter can be detected. For this reason, the number of times the write loop is repeated until memory cells pass the program verification is greater in the detection writing than in the application writing, and the smart verify operation using a smart verify voltage SV is also performed in the write loop. Thus, the detection writing takes a longer time than the write operation in which the smart verify operation is not performed.

However, if the application writing is only performed and the detection writing is not performed, as the write characteristics are changed because of worn-out memory cells, the risk of over-programming increases. For this reason, in smart verification, it is necessary to perform the detection writing at a certain frequency, in order to use an appropriate write parameter in the application writing. In other words, although the writing time can be shortened in the application writing, reliability of the write voltage is lowered as the write characteristics change. For this reason, it is impossible to perform only the application writing in order to shorten the writing time. In the detection writing, the writing time tends to be longer, but this process can catch up with the change of the write characteristics; accordingly, the reliability of the write voltage is increased. However, if the detection writing is performed at a high frequency with an emphasis on maintaining the reliability of the write voltage, the writing time cannot be shortened. Accordingly, it is necessary to perform the application writing while performing the detection writing at an appropriate frequency.

To this end, a feedback writing is performed in the embodiments, in addition to the detection writing and the application writing. The feedback writing has advantages of both of the detection writing and the application writing. That is, the feedback writing is capable of improving appropriateness of a write parameter, which is an objective of the detection writing, and shortening a writing time, which is an objective of the application writing. The feedback writing is a write scheme in which appropriateness of a write parameter is checked in a shorter time compared to the detection writing, and the write parameter is adjusted based on a result of the check.

1.2.3 Write Operation of Embodiments

In an example of the write operation, the detection writing, the feedback writing, and the application writing are performed; however, only the feedback writing may be performed during the write operation.

1.2.3.1 Interface Between Controller and NAND Flash Memory

Figure 6:
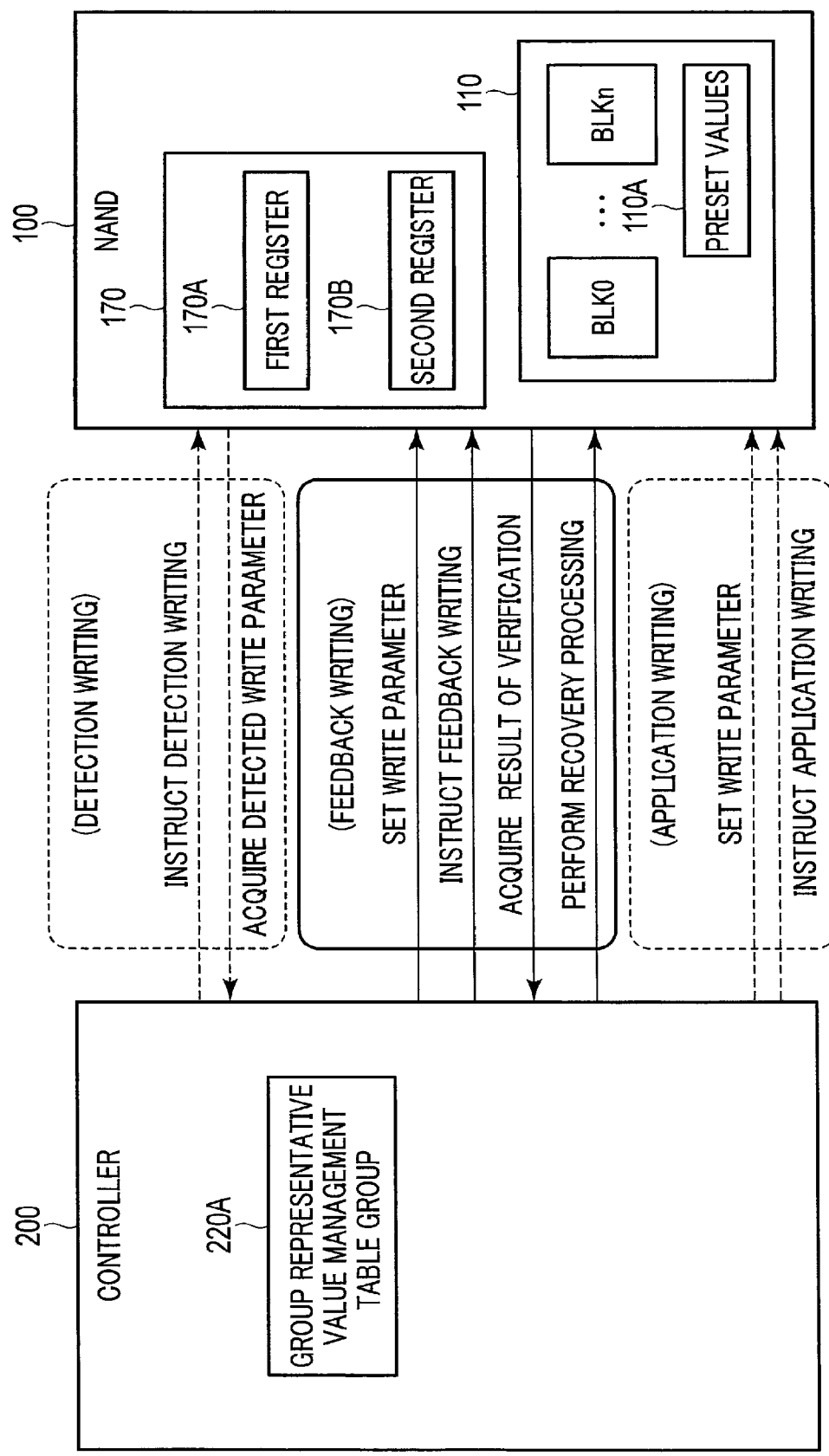
FIG. 6 is a drawing showing a sequence for a write operation performed between a controller and a NAND flash memory in embodiments.

Next, an interface between the controller 200 and the NAND flash memory 100 in the write operation according to the embodiments will be described. FIG. 6 is a drawing showing a sequence for a write operation performed between the controller 200 and the NAND flash memory 100.

The NAND flash memory 100 has a register 170. The register 170 has a first register 170A, in which a write parameter is to be set, and a second register 170B, in which a check result obtained by the feedback writing and a detection result obtained by the detection writing are to be stored. A write parameter is acquired by the detection writing, or changed by the feedback writing.

A preset value is stored in, for example, the memory cell 110A of the memory cell array 110. The preset value is information stored in a ROM region of the NAND flash memory 100 before it is shipped, and includes information such as a preset write voltage, which is used in the detection writing, for example.

The controller 200 has a group representative value management table group 220A in which information about group representative values are managed. The group representative values include information such as write parameters for each memory cell group, for example, for each page or each block. The controller 200 manages the group representative values for each group. For example, a group is set so as to include a plurality of memory cells which are expected to have similar write characteristics. The NAND flash memory 100, in place of the controller 200, may manage the write parameters for each group. The management table group 220A is stored in the built-in memory 220, for example.

Hereinafter, the sequence performed by the controller 200 and the NAND flash memory 100 will be described.

In the NAND flash memory 100, the detection writing, the feedback writing, and the application writing are performed as a write operation.

The sequence in the detection writing will be described. The controller 200 instructs the NAND flash memory 100 to perform the detection writing. The NAND flash memory 100 performs the detection writing using a preset write voltage stored as the preset value, and detects a write parameter.

The NAND flash memory 100 stores the detected write parameter in the second register 170B. Subsequently, the NAND flash memory 100 sends the write parameter stored in the second register 170B to the controller 200 in response to an acquisition command from the controller 200. The controller 200 thereby acquires the write parameter detected by the detection writing, and stores the write parameter as a group representative value in the management table group 220A in the built-in memory 220. As the acquisition command, a status read command or a "Get feature" command is used, for example. The status read command and the "Get feature" command will be described later in detail.

The sequence in the feedback writing is described below. The controller 200 sends, as the write parameter, the group representative value stored in the management table group 220A in the built-in memory 220 to the NAND flash memory 100. The NAND flash memory 100 stores the received write parameter in the first register 170A.

Subsequently, the controller 200 instructs the NAND flash memory 100 to perform the feedback writing. The NAND flash memory 100 performs the feedback writing using the write parameter stored in the first register 170A, and stores, in the second register 170B, the result of checking obtained in the feedback writing. The NAND flash memory 100 further sends the result of checking stored in the second register 170B to the controller 200 in response to an acquisition command from the controller 200. The controller 200 acquires the result of checking obtained in the feedback writing, and updates the group representative value based on the result of checking, and stores it in the management table group 220A. The result of checking includes information representing appropriateness of the write parameter which has been checked by the feedback writing. Furthermore, if it is determined from the result of checking that over-programming occurs, the controller 200 performs recovery processing to the NAND flash memory 100. For example, the controller 200 sends a command to direct the NAND flash memory 100 to perform the recovery processing.

The sequence in the application writing will be described. The controller 200 sends, as the write parameter, the group representative value stored in the management table group 220A in the built-in memory 220 to the NAND flash memory 100. The NAND flash memory 100 stores the write parameter in the first register 170A. Subsequently, the controller 200 instructs the NAND flash memory 100 to perform the application writing. The NAND flash memory 100 performs the application writing using the write parameter stored in the first register 170A.

1.2.3.2 Management Table Group in Controller

Next, the management table group 220A of the controller 200 is described. FIGS. 7A through 7D show an example of the management table group possessed by the controller. The management table group 220A is stored in the built-in memory 220, and includes, for example, a group definition table 220A_1 shown in FIG. 7A, a group write parameter table 220A_2 shown in FIG. 7B, a feedback writing cycle definition table 220A_3 shown in FIG. 7C, and a feedback writing schedule table 220A_4 shown in FIG. 7D.

The group definition table 220A_1 shown in FIG. 7A defines a set of word lines included in a memory cell group (GR) that shares one group representative value. For example, each group may include one word line or a plurality of word lines. Each group may include one block or a plurality of blocks. As shown in FIG. 7A, for example, group GR0 includes word lines WL0 through WL7, group GR1 includes word lines WL8 through WL23, group GR2 includes word lines WL24 through WL39, and group GR3 includes word lines WL40 through WL47.

The group write parameter table 220A_2 shown in FIG. 7B stores write parameters used for, for example, groups in each block. For example, write parameter A10 corresponds to group GR0 in block BLK1. Accordingly, write parameter A10 is used in the feedback writing and the application writing performed for the memory cells included in group GR0 of block BLK1. For example, in the feedback writing performed for the memory cells included in group GR0 in block BLK1 as a write target, write parameter A10 is set in the first register 170A, and the feedback writing using write parameter A10 is performed. As shown in FIG. 7B, write parameters A11, A12, and A13 respectively correspond to groups GR1, GR2, and GR3 in block BLK1.

The feedback writing cycle definition table 220A_3 shown in FIG. 7C defines the number of write/erase (P/E) cycles at which the feedback writing should be performed. For example, the table defines performing of the feedback writing if the write/erase (P/E) cycles for a write target group reaches any of 100, 300, 500, or 700, in other words, when the P/E cycle reaches 100 and every time the number is increased by 200 thereafter. The cycle definition table 220A_3 shown in FIG. 7C may be prepared for each group. The intervals of the number of cycles in which the feedback writing is performed may be or may not be constant.

The feedback writing schedule table 220A_4 shown in FIG. 7D stores the number of write/erase (P/E) cycles at which the feedback writing should be performed next time. When the number of P/E cycles for a write target group reaches the number of cycles stored in the schedule table 220A_4, the feedback writing is performed. For example, when the number of P/E cycles for group GR0 in block BLK0 reaches 100, the feedback writing is performed.

Furthermore, when the feedback writing is performed, the controller 200 updates the number of P/E cycles in the schedule table 220A_4 to the number of P/E cycles defined in "TIMING 1" to "TIMING 4" in the cycle definition table 220A_3. For example, for group GR0 in block BLK2, the feedback writing is performed when the number of P/E cycles is 100, and thereafter, the number of P/E cycles in the schedule table 220A_4 is updated from 100 to 300 as shown in FIG. 7D.

1.2.3.3 Flow of Write Operation

Next, the write operation in the embodiments will be described with reference to FIG. 8, which is a flowchart showing the write operation according to the embodiments. The write operation shown in FIG. 8 is performed by the controller 200.

First, the controller 200 determines whether a group representative value (for example, a write parameter including a write voltage) for a group including write target memory cells has already been acquired or not. In other words, the controller 200 determines whether or not the group representative value of the write target group is stored in the write parameter table 220A_2 (step S1). If the group representative value is not stored (NO in step S1), the controller 200 instructs resetting of the first register 170A, or does not instruct a write parameter to be set in the first register 170A, so that a preset value stored in the NAND flash memory 100 will be stored in the first register 170A. The write parameter as the preset value is thereby set as a write voltage VPGM to be used in a detection writing (step S2).

Next, the controller 200 instructs the NAND flash memory 100 to perform the detection writing (step S3). The NAND flash memory 100 thereby performs the detection writing using the predefined write voltage VPGM, and obtains a result of detection. The controller 200 acquires the result of detection obtained by the detection writing (step S4). Furthermore, the controller 200 stores the initial voltage VPGM determined as the result of detection in the write parameter table 220A_2 as a group representative value (step S5). The write operation then ends.

In step S1, if the group representative value of the write target group has already been stored in the write parameter table 220A_2 (YES in step S1), the controller 200 stores the group representative value in the first register 170A of the NAND flash memory 100, thereby setting the group representative value as an initial voltage VPGM (step S6).

Next, the controller 200 refers to the schedule table 220A_4, and determines whether or not the feedback writing is to be performed in accordance with the schedule table 220A_4 (step S7). Specifically, when the number of P/E cycles reaches 100, 150, 200, or 250, it is determined that the feedback writing needs to be performed.

In step S7, if it is determined that the feedback writing should be performed (YES in step S7), the controller 200 instructs the NAND flash memory 100 to perform the feedback writing (step S8). The NAND flash memory 100 thereby performs the feedback writing using the group representative value instructed as the write parameter in step S6, and obtains a result of checking for the group representative value. The controller 200 acquires the result of checking obtained in the feedback writing (step S9). The details of the feedback writing will be described later.

Next, the controller 200 determines the result of checking, and updates the group representative value based on the result of checking (step S10). The details of the processing in step S10 will be described later with reference to FIG. 14. The write operation then ends.

If it is determined that the feedback writing is not to be performed (No in step S7), the controller 200 instructs the NAND flash memory 100 to perform the application writing (step S11). The NAND flash memory 100 thereby performs the application writing using the group representative value instructed as a write parameter in step S6. The write operation then ends.

Figure 9:
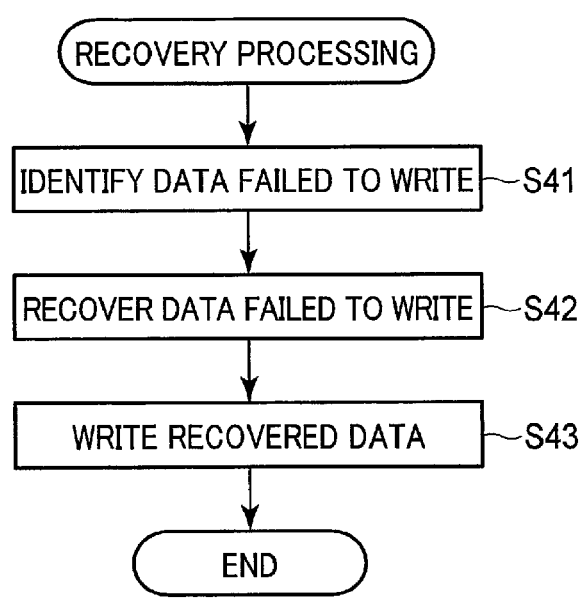
FIG. 9 is a flowchart showing an operation of recovery processing performed in a case where it is determined that over-programming occurs in the flowchart shown in FIG. 8.

If the controller 200 determines an occurrence of over-programming during the process of determining the result of checking in step S10, the controller 200 performs recovery processing. FIG. 9 is a flowchart showing an operation of the recovery processing when over-programming occurs.

First, if the recovery processing is performed, the controller 200 specifies data to be written into a memory cell where the over-programming occurs, in other words, data to be written into a memory cell that fails the writing (step S41).

Subsequently, the controller 200 obtains data to be written into the memory cell that fails the writing (step S42). For example, if the memory system is configured in such a manner that write data is stored in a buffer until a writing is finished with no abnormalities, the data to be written into the memory cell that fails the writing is obtained from such a buffer. If the data to be written into the memory cell that fails the writing is stored in a single-level cell (SLC) buffer, the data is obtained from such an SLC buffer. If it is a time to execute compaction and there is the data to be written into the memory cell that fails the writing in a block which is a target for compaction, the data is obtained from such a block. If an ECC circuit 260 configures an inter-page product code, the data to be written into the memory cell that fails the writing is recovered by using the product code.

Next, the controller 200 instructs the NAND flash memory 100 to write the obtained data (step S43). The writing of the obtained data may be performed to a memory cell different from the memory cell that fails the writing, or to the memory cell for which the writing fails after performing an erase operation. The recovery processing then ends.

When it is determined that over-programming occurs, loss of data can be prevented by performing the recovery processing for data to be written into a memory cell in which the over-programming occurs as described above.

1.2.3.4 Feedback Writing

Next, the feedback writing performed in the write operation will be described. As described above, the feedback writing is a write scheme in which appropriateness of a write parameter is checked in the NAND flash memory in a shorter time in comparison to the detection writing, and a result of checking is transmitted to the controller. Furthermore, as an application of the scheme, the controller adjusts a write parameter based on the result of checking.

FIGS. 10 and 11 are drawings showing an interface between the controller and the NAND flash memory in the feedback writing. FIG. 10 shows a case where no over-programming occurs as a result of the program operation, and FIG. 11 shows a case where over-programming occurs in the program operation.

The controller 200 sets group representative value V0 stored in the write parameter table 220A_2 to the first register 170A of the NAND flash memory 100 (the arrow (1) in FIG. 10). Subsequently, the controller 200 instructs the NAND flash memory 100 to perform the feedback writing (the arrow (2) in FIG. 10).

The NAND flash memory 100 performs the feedback writing using group representative value V0 instructed as a write parameter, to a write target instructed by the controller 200, for example, to memory cells included in group GR0 in block BLK0 (the arrow (2-1) in FIG. 10). Then, the NAND flash memory 100 stores the result of checking of the write parameter which is obtained by the feedback writing to the second register 170B as status information, for example (the arrow (2-2) in FIG. 10).

Next, the controller 200 acquires the result of checking (e.g., status information) from the second register 170B using an acquisition command (the arrow (3) in FIG. 10) for example, and updates group representative value V0 stored in the write parameter table 220A_2 to group representative value Vx based on the result of checking (the arrow (4) in FIG. 10).

As described above, the controller 200 updates the group representative value V0 to Vx and finishes the operation, when the controller 200 determines that the result of checking obtained in the feedback writing does not indicate the occurrence of over-programming.

On the other hand, if it is determined that the result of checking indicates the occurrence of over-programming (OP), the controller 200 performs recovery processing for the over-programming. The controller 200 recovers data to be written into a memory cell where the over-programming occurs, and instructs the NAND flash memory 100 to write the data once again as shown (5) in FIG. 11.

As described above, a full-sequence programming and a multiple-stage write scheme (e.g., two-stage programming or foggy-fine programming) are known as write schemes.

It is known that, in a two-dimensional NAND flash memory in which memory cells are two-dimensionally arranged, and a three-dimensional NAND flash memory in which memory cells are three-dimensionally arranged, word lines WL next to each other are susceptible to inter-cell interference. To mitigate an influence of the inter-cell interference, a multiple-stage writing scheme has been proposed for a two-dimensional NAND flash memory and a three-dimensional NAND flash memory. Since there are no great differences between two-stage programming and foggy-fine programing, except for the number of pages to which data to be written and an initial voltage VPGM to be applied, two-stage programming will be described as an example.

In the two-stage programming in a three-dimensional NAND flash memory, a first-stage write operation is first performed to a first word line, and then a first-stage write operation is performed to a second word line that is next to the first word line. When the first-stage write operation to the second word line is finished, a second-stage write operation is performed to the first word line. In a three-dimensional NAND flash memory, there are pages to which data is written in an arrangement direction in which the string units are arranged. Therefore, a write operation is performed in consideration of the inter-cell interference on the arrangement direction.

In the two-stage programming in a two-dimensional NAND flash memory, similarly to the case of a three-dimensional NAND flash memory, a first-stage write operation is first performed to a first word line, and then a first-stage write operation is performed to a second word line that is next to the first word line. When the first-stage write operation to the second word line is finished, a second-stage write operation is performed to the first word line. The detailed description of the two-stage programming will be omitted, as it is the same as that of the three-dimensional NAND flash memory, except that there is only one string unit in the two-dimensional NAND flash memory.

An example of the writing order of the two-stage programming in the three-dimensional NAND flash memory will be described.

FIG. 12 shows an example of the writing order in a case where data is written into a three-dimensional NAND flash memory by two-stage programming. One block is divided into four string units, SU0 to SU3. The example shown in FIG. 12 is a case where data of a lower page (L), data of a middle page (M), and data of an upper page (U) are respectively written into the memory cells (cell units) of string units SU0 to SU3 coupled to four word lines, WL0 to WL3. In the two-stage programming, the data of lower pages is written in the first-stage write operation, and the data of the rest of the pages, herein the middle and upper pages, are written in the second-stage write operation.

As shown in FIG. 12, the data of the lower pages is written into the memory cells (cell units) of string units SU0 to SU3 coupled to word line WL0 in order "0→1→2→3". Subsequently, the data of the lower pages is written into the memory cells of string units SU0 to SU3 coupled to word line WL1 in order "4→5→6→7".

Next, the data of the middle and upper pages is written into the memory cells of string units SU0 to SU3 coupled to word line WL0 in order "8→9→10→11". Subsequently, the data of the lower pages is written into the memory cells of string units SU0 to SU3 coupled to word line WL2 in order "12→13→14→15". Next, the data of the middle and upper pages is written into the memory cells of string units SU0 to SU3 coupled to word line WL1 in order "16→17→18→19".

Next, the data of lower page is written into the memory cells of string units SU0 to SU3 coupled to word line WL3 in order "20→21→22→23". Subsequently, the data of middle and upper pages is written into the memory cells of string units SU0 to SU3 coupled to word line WL2 in order "24→25→26→27".

The change in the threshold voltage distributions of the memory cells during the process of the two-stage programming is shown in (a) to (c) of FIG. 13. In FIG. 13, (a) shows the threshold voltage distribution of memory cells in the erasure state, namely the "Er" state. First, the first-stage writing is performed so that the threshold voltage distribution of the memory cells to be written to an "LM" state is shifted. Thus, as shown in (b) of FIG. 13, some of the memory cells are shifted from the "Er" state to, for example, the "LM" state which is between the "C" state and "D" state. Subsequently, after the first stage, as shown in (c) of FIG. 13, the second-stage writing is performed so that the distribution of the "Er" state is divided into "Er", "A", "B", "C" states and the distribution of the "LM" state is divided into "D", "E", "F", and "G" states. In other words, in the second-stage writing, data are written so that the memory cells in the "Er"

state are changed to the "A", "B", or "C" state, and thereafter, the memory cells in the "LM" state shifted to the "D", "E", "F", or "G" state.

An example wherein the feedback writing is adopted in the full-sequence programming and two-stage programming will be described.

Feedback Writing in First Embodiment (First to Third Examples)

Next, first to third examples will be described as examples in which the feedback writing in a first embodiment is adopted. In the first example, an additional verify operation is added to the program verify operation in the first write loop in the full-sequence programming.

Figure 14:
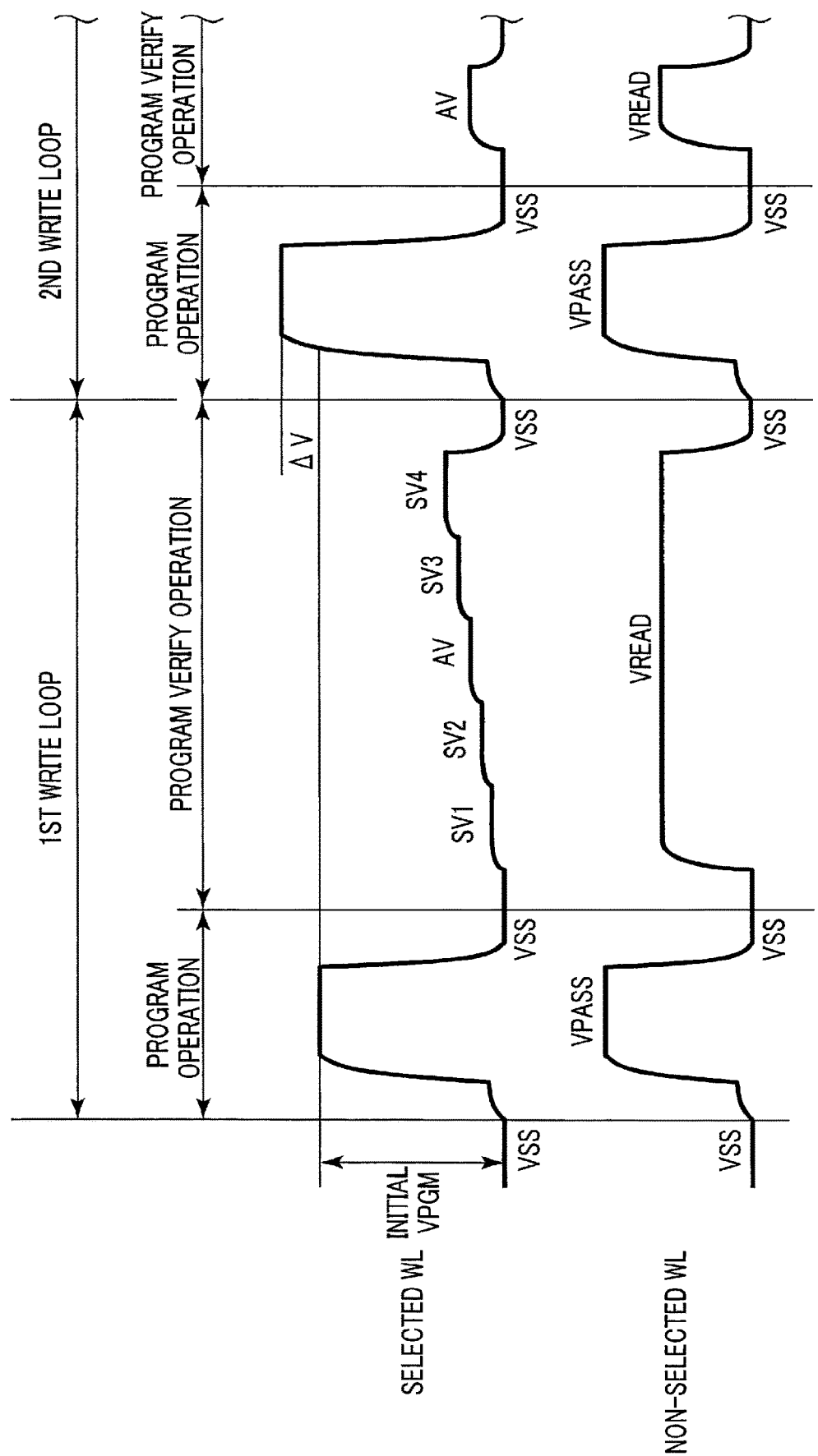
FIG. 14 is a drawing showing word line voltages in a program operation and a verify operation of a feedback writing in an embodiment (a first example).

FIG. 14 shows the word line voltages in the program operation and the program verify operation performed in the feedback writing in the first example. In the first example and the rest of the examples, the memory cells are to be written into the "A" state.

In the first write loop of the write operation, a group representative value or a corrected group representative value is used as an initial voltage VPGM to perform the program operation. The initial voltage VPGM applied to a selected word line WL is a write voltage updated or corrected based on a result of checking obtained in the detection writing or the previous feedback writing. A voltage VPASS is applied to non-selected word lines WL. The application of the voltage VPASS to the non-selected word lines WL is the same in the rest of the examples.

Next, verify voltages SV1 and SV2 are applied to the selected word line WL to perform a smart verify operation based on each of the verify voltages. Subsequently, the verify voltage AV corresponding to the "A" state is applied, and a program verify operation and a smart verify operation are performed. Verify voltages SV3 and SV4 are further applied to perform a smart verify operation based on each of the verify voltages. The magnitude relationship among these verify voltages is SV1<SV2<AV<SV3<SV4, for example. A voltage VREAD is applied to non-selected word lines WL. The application of the voltage VREAD to the non-selected word lines WL is the same in the rest of the examples.

Thereafter, if a memory cell does not pass the program verification in the first write loop, a write loop that includes a program operation in which the voltage VPGM is incremented by $\Delta V$ and a program verify operation using the program verify voltage AV is repeated. In the second write loop, the smart verify operation is not performed.

In the program verify operation of the foregoing first write loop, the verify voltages SV1, SV2, AV, SV3, and SV4 are sequentially applied to the selected word line WL, and the smart verify operation is performed based on each of the voltages. By these smart verify operations, whether or not the initial voltage VPGM in the feedback writing is appropriate for the write target memory cells is verified.

Figure 15A:
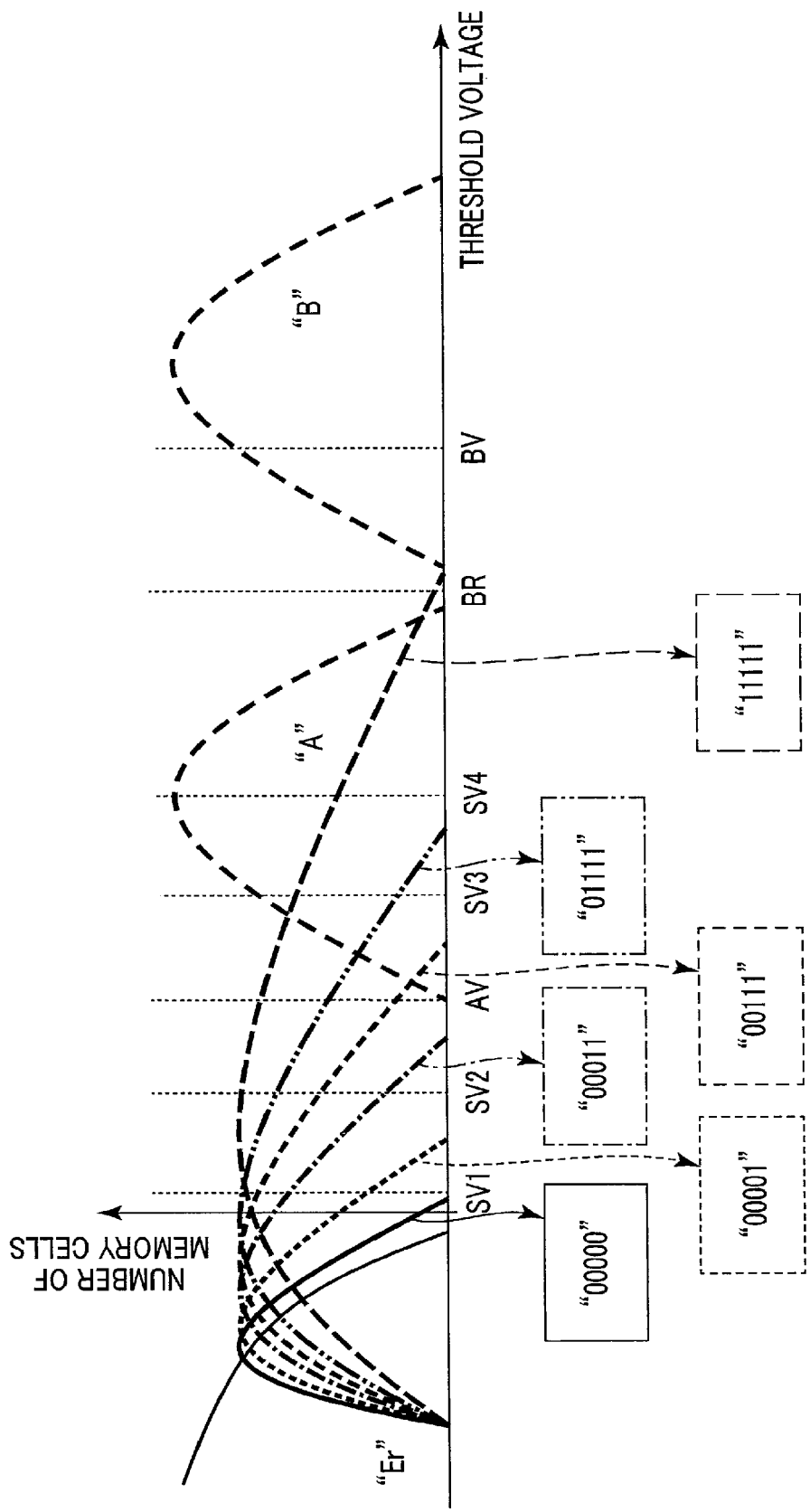

FIGS. 15A and 15B show the threshold voltage distributions of the memory cells as a result of the program operation, and status information based on a result of verification. After the program operation, the smart verify operation is performed using each of the verify voltages SV1, SV2, AV, SV3, SV4, thereby obtaining information regarding whether the higher tail of the threshold voltage distribution exceeds each of the voltages SV1, SV2, AV, SV3, and SV4. The higher tail of the threshold voltage distribution exceeding a smart verify voltage means that the number of memory cells of which the threshold voltage is determined to exceed the smart verify voltage becomes greater than a first threshold value. The status information as a result of the verification includes information regarding whether the higher tail of the threshold voltage distribution exceeds each of the voltages. The status information is thus generated based on a result of the verification in accordance with each threshold voltage distribution after a writing is performed to the memory cells using the voltage VPGM.

FIG. 15A shows the example where the information of each threshold voltage distribution is included in the status information. The information of each threshold voltage distribution is expressed by a data string of five bits. The five bits in the data string respectively indicate whether or not the higher tail of the threshold voltage distribution exceeds the verify voltages SV1, SV2, AV, SV3, and SV4, from lower to higher bits. "0" indicates not exceeding; "1" indicates exceeding.

For example, a case where the higher tail of the threshold voltage distribution of the memory cells does not exceed the verify voltage SV1 is expressed as "00000". A case where the higher tail of the threshold voltage distribution exceeds the verify voltage SV1, and does not exceed the voltage SV2 is expressed as "00001". A case where the higher tail of the threshold voltage distribution exceeds the verify voltage SV2, and does not exceed the voltage AV is expressed as "00011". A case where the higher tail of the threshold voltage distribution exceeds the verify voltage AV, and does not exceed the voltage SV3 is expressed as "00111". A case where the higher tail of the threshold voltage distribution exceeds the verify voltage SV3, and does not exceed the voltage SV4 is expressed as "01111". A case where the higher tail of the threshold voltage distribution exceeds the verify voltage SV4 is expressed as "11111".

The information of each threshold voltage distribution may be expressed by a data string of three bits. It is sufficient to store six states of the status information. Accordingly, as shown in FIG. 15B, the six states can be stored by using a data string of three bits.

The data string of three bits or five bits as a result of the verification is stored in the second register 170B. The controller 200 acquires the string of data stored in the second register 170B by an acquisition command, and updates the group representative value based on the acquired data string.

FIG. 16 is a drawing showing updates of a group representative value and the determination of occurrence/non-occurrence of over-programming based on a result of verification in the feedback writing in step S10 shown in FIG. 8. As shown in FIG. 16, the controller 200 updates a group representative value based on a result of verification, and determines whether or not over-programming occurs in a memory cell.

As shown in FIG. 16, at the time of a smart verify operation in the feedback writing, if the higher tail of the threshold voltage distribution of memory cells does not exceed the verify voltage SV1, in other words, if the number of memory cells which is turned to an off state by the smart verify operation using the verify voltage SV1 is less than the first threshold value, the controller 200 increases the group representative value in the write parameter tables 220A_2 in two steps to "voltage VPGM+2×$\Delta V$", and determines that over-programming does not occur at this time.

When the higher tail of the threshold voltage distribution of the memory cells exceeds the verify voltage SV1 but does not exceed the voltage SV2, in other words, if the number of memory cells which are in an off state in the smart verification operation using the verify voltage SV1 is equal to or greater than the first threshold value, and the number of memory cells which are in an off state in the smart verification operation using the verify voltage SV2 is less than the first threshold value, the controller 200 increases the group representative value in the write parameter table 220A_2 in one step to "voltage VPGM+ΔV", and determines that over-programming does not occur at this time.

When the higher tail of the threshold voltage distribution of the memory cells exceeds the verify voltage SV2 but does not exceed the voltage AV, in other words, if the number of memory cells which are in an off state in the smart verify operation using the verify voltage SV2 is equal to or greater than the first threshold value, and the number of memory cells which are in an off state in the smart verify operation using the verify voltage AV is less than the first threshold value, the controller 200 maintains the group representative value in the write parameter table 220A_2, and determines that over-programming does not occur at this time.

If the higher tail of the threshold voltage distribution of the memory cells exceeds the verify voltage AV but does not exceed the verify voltage SV3, in other words, if the number of memory cells which are in an off state by the smart verify operation using the verify voltage AV is equal to or greater than the first threshold value, and the number of memory cells which are in an off state by the smart verify operation using the voltage SV3 is less than the first threshold value, the controller 200 decreases the group representative value in the write parameter tables 220A_2 in one step to "voltage VPGM−ΔV", and determines that over-programming does not occur at this time.

If the higher tail of the threshold voltage distribution of the memory cells exceeds the verify voltage SV3 but does not exceed the verify voltage SV4, in other words, if the number of memory cells which are in an off state by the smart verify operation using the verify voltage SV3 is equal to or greater than the first threshold value, and the number of memory cells which are in an off state by the smart verify operation using the voltage SV4 is less than the first threshold value, the controller 200 decreases the group representative value in the write parameter tables 220A_2 in two steps to "voltage VPGM−2×ΔV", and determines that over-programming does not occur at this time.

If the higher tail of the threshold voltage distribution of the memory cells exceeds the verify voltage SV4, in other words, if the number of memory cells which are in an off state by the smart verify operation using the verify voltage SV4 is equal to or greater than the first threshold value, the controller 200 decreases the group representative value in the write parameter tables 220A_2 in three steps to "voltage VPGM−3×ΔV". Furthermore, since there is possibility that over-programming occurs in a memory cell, the controller 200 performs recovery processing for the over-programming to recover data to be written into the memory cell where the over-programming occurs, and instructs the NAND flash memory 100 to write the data once again. The processing then ends.

Thus, the group representative value updated based on a result of verification is used as an initial voltage VPGM in a first-time write loop in a next write operation. It is thereby possible to prevent an occurrence of over-programming, to dynamically adjust a write voltage in accordance with a change in characteristics of the memory cells, and to shorten a time required for a write operation.

Next, the second example in which a feedback writing is adopted as a write operation performed in the first stage of the second-stage programming will be described. In the second example, an additional smart verify operation is added to the program verify operation in the first write loop in a write operation of the first stage.

Figure 17:
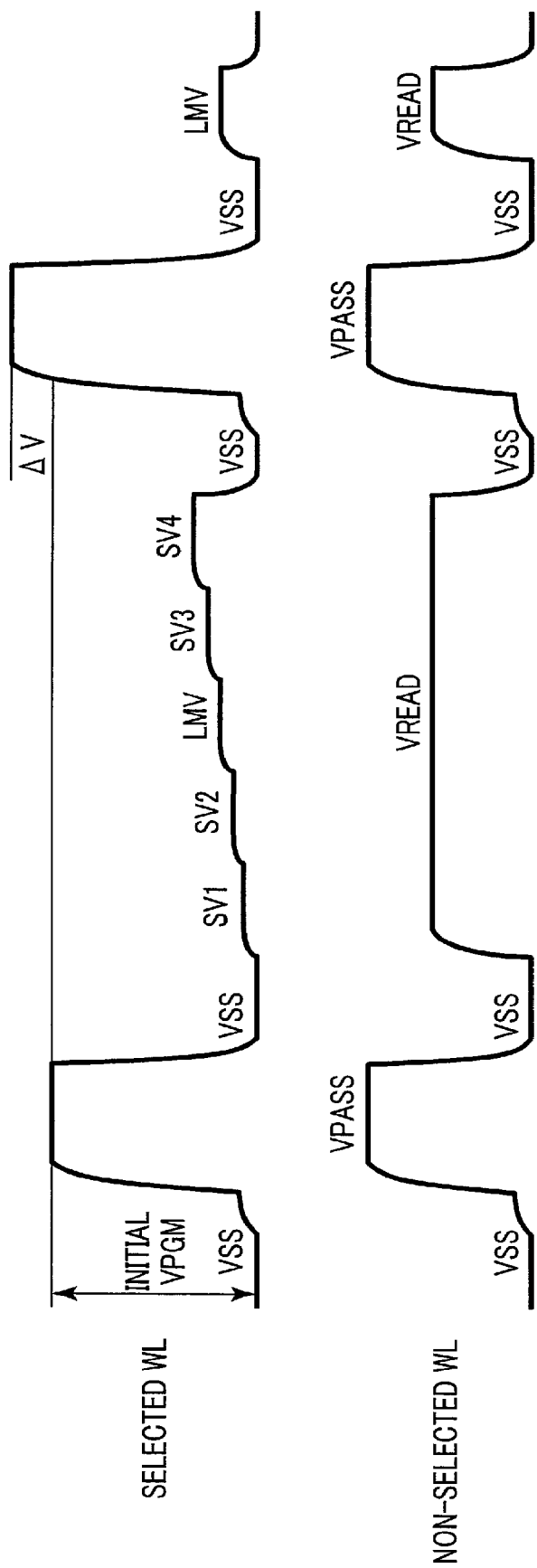
FIG. 17 is a drawing showing word line voltages in a program operation and a verify operation for a feedback writing in an embodiment (a second example).

FIG. 17 shows the word line voltages in the program operation and the program verify operation performed in the feedback writing of the second example. An initial voltage VPGM is applied to a selected word line WL to perform the program operation. Next, in the program verify operation, verify voltages SV1 and SV2 are applied to the selected word line WL to perform a smart verify operation based on each of the verify voltages. Subsequently, the verify voltage LMV corresponding to the "LM" state is applied, and the program verify operation and the smart verify operation are performed. Verify voltages SV3 and SV4 are further applied to perform the smart verify operation based on each of the verify voltages. The magnitude relationship among these verify voltages is SV1<SV2<LMV<SV3<SV4, for example.

Differences of the second example from the first example shown in FIG. 14 are that the verify voltage LMV is applied instead of the verify voltage AV, and the verify voltage SV1, SV2, and SV3, and SV4 are adjusted in accordance with the verify voltage LMV. The rest of the configuration and advantageous effects is the same as in the first example. In the two-stage programming, a write operation in the second stage is performed after performing a write operation in the first stage; however, a write parameter that is set is different between the first stage and the second stage. For this reason, the controller 200 manages the write parameter in each of the write operation in the first stage and the write operation in the second stage. In other words, the controller 200 manages the write parameters in the write operations in the first stage and the second stage in different tables.

Next, the third example in which the feedback writing is adopted as a write operation in the second stage of the two-stage programming will be described. In the third example, an additional smart verify operation is added to the program verify operation in the first write loop in the write operation of the second stage.

FIG. 18 shows the word line voltages in the program operation and the program verify operation performed in the feedback writing in the third example. In the third example, it is necessary to restore data for a lower page, that is, "LM" data, in order to write eight values in the write operation in the second stage. For this reason, the read voltage LMR corresponding to the "LM" data is used to read the "LM" data. Thereafter, an initial voltage VPGM is applied to a selected word line WL to perform a program operation. Next, in the program verify operation, verify voltages SV1 and SV2 are applied to the selected word line WL to perform the smart verify operation based on each of the verify voltages. Subsequently, the verify voltage AV corresponding to the "A" state is applied, and the program verify operation and the smart verify operation are performed. Verify voltages SV3 and SV4 are further applied to perform the smart verify operation based on each of the verify voltages. The magnitude relationship among those verify voltages is SV1<SV2<AV<SV3<SV4, for example.

Differences of the third example from the first example shown in FIG. 14 is only that a read operation at the read voltage LMR is performed prior to the "A" state write operation. The rest of the configuration and advantageous effects is the same as in the first example.

Feedback Writing in Second Embodiment (Fourth to Sixth Examples)

Next, the fourth to sixth examples in which the feedback writing according to a second embodiment is adopted will be described. In the fourth example, the detection of a write parameter by smart verification is performed using the program verify voltage AV in the "A" state. If a memory cell passes the smart verification, in addition to the program verify operation, a verify operation is performed to determine whether or not over-programming occurs. In this verify operation, the verify voltage AVH higher than the verify voltage AV is used. Hereinafter, the verification for determining an occurrence of over-programming will be referred to as an OP verify operation.

Figures 20, 21:
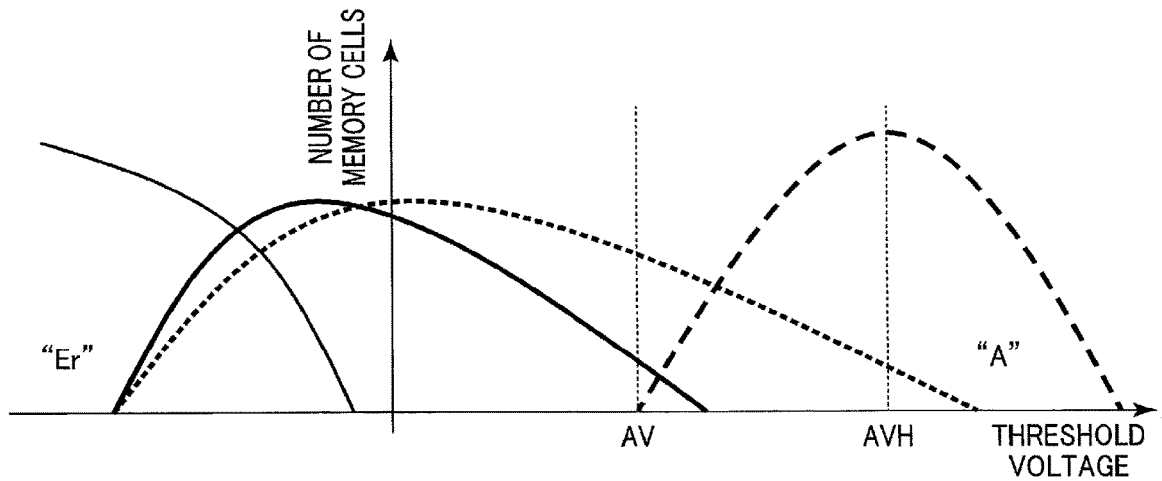
FIG. 20 is a drawing showing threshold voltage distributions of memory cells after a program operation.
FIG. 21 is a drawing showing an example of status information which is determined based on results of verifications obtained in a feedback writing.

FIG. 19 shows the word line voltages in the program operation and in the verify operation performed in the feedback writing in the fourth example. FIG. 20 shows the threshold voltage distributions of memory cells after a program operation. In the fourth example, as shown in FIG. 19, after performing a program operation, a smart verify operation is performed using the program verify voltage AV as a smart verify voltage. A smart verify operation is performed to determine whether or not the number of memory cells, of which a threshold voltage is equal to or higher than the program verify voltage AV, is equal to or greater than a first threshold value, and if the memory cells pass smart verification, an OP verify operation using the verify voltage AVH, which is higher than the program verify voltage AV, is performed.

As shown in FIG. 19, in the first write loop, the initial voltage VPGM is applied to a selected word line WL to perform a program operation. Subsequently, the verify voltage AV corresponding to the "A" state is applied to the selected word line WL to perform a smart verify operation. For example, suppose the number of memory cells, of which threshold voltages are determined to be equal to or higher than the program verify voltage AV, is less than the first threshold value, and such memory cells fail the smart verification, the process then proceeds to a second write loop.

In the second write loop, "voltage VPGM+ΔV" is applied to the selected word line WL to perform a program operation. Subsequently, the verify voltage AV corresponding to the "A" state is applied to the selected word line WL to perform a smart verify operation. Even herein, suppose the number of memory cells, of which threshold voltages are determined to be equal to or higher than the verify voltage AV, is less than the first threshold value, and such memory cells fail the smart verification, the process proceeds to a third write loop.

In the third write loop, "voltage VPGM+2×ΔV" is applied to the selected word line WL to perform a program operation. Subsequently, the verify voltage AV corresponding to the "A" state is applied to the selected word line WL to perform a smart verify operation. Herein, it is determined, for example, that the number of memory cells, of which the threshold voltages are equal to or higher than the program verify voltage AV, is equal to or greater than the first threshold value, and the memory cells pass the smart verification. When the smart verification is passed, the voltage AVH, which is higher than the verify voltage AV, is applied to the selected word line WL to perform an OP verify operation. The voltage AVH is a verify voltage for detecting over-programming.

As described above, the example shown in FIG. 19 is an example in which memory cells have passed the smart verification using the verify voltage AV in the "A" state in the smart verify operation in the third write loop of the write operation. If the smart verification is passed, the OP verify operation using the additional verify voltage AVH is performed. The controller 200 determines whether or not over-programming occurs based on a result of the verification obtained by the OP verify operation using the verify voltage AVH. In the OP verify operation, if the number of memory cells, of which threshold voltages are determined to exceed the verify voltage AVH, is equal to or greater than a second threshold value, it is determined that the over-programming occurs at this time.

Next, the method of determining the status information based on a result of verification in the fourth example will be described. FIG. 21 shows an example of the status information which is determined based on results of verifications obtained in the feedback writing.

In the fourth example, the NAND flash memory 100 obtains, as a result of verification in the feedback writing, the number of write loops in which the smart verification using the verify voltage AV is passed, and information regarding the occurrence/non-occurrence of over-programming that is obtained by the OP verify operation. It is determined that over-programming occurs in the OP verify operation when the number of memory cells of, which threshold voltages are determined to exceed the verify voltage AVH, is equal to or greater than a second threshold value.

The NAND flash memory 100 determines 8-bit status information [7:0] based on the number of write loops and the information regarding the occurrence/non-occurrence of over-programming in the OP verify operation, as shown in FIG. 21. The status information [7] indicates the occurrence/non-occurrence of over-programming, and the status information [6:0] indicates the number of write loops in which the smart verification using the verify voltage AV is passed.

The row (a) shown in FIG. 21 shows a case where the number of write loops in which the smart verification at the verify voltage AV is passed is one, and the over-programming occurs when the smart verification is passed. In this case, the status information [7:0] is "10000001".

The row (b) shown in FIG. 21 shows a case where the number of write loops in which the smart verification at the verify voltage AV is passed is one, and the over-programming does not occur when the smart verification is passed. In this case, the status information [7:0] is "00000001".

The row (c) shown in FIG. 21 shows a case where the number of write loops in which the smart verification at the verify voltage AV is passed is two, and the over-programming occurs when the smart verification is passed. In this case, the status information [7:0] is "10000010".

The row (d) shown in FIG. 21 shows a case where the number of write loops in which the smart verification at the verify voltage AV is passed is two, and the over-programming does not occur when the smart verification is passed. In this case, the status information [7:0] is "00000010".

The row (e) shown in FIG. 21 shows a case where the number of write loops in which the smart verification at the verify voltage AV is passed is three, and the over-programming occurs when the smart verification is passed. In this case, the status information [7:0] is "10000011".

The row (f) shown in FIG. 21 shows a case where the number of write loops in which the smart verification at the verify voltage AV is passed is three, and the over-programming does not occur when the smart verification is passed. In this case, the status information [7:0] is "00000011".

The row (g) shown in FIG. 21 shows a case where the number of write loops in which the smart verification at the verify voltage AV is passed is four, and the over-programming occurs when the smart verification is passed. In this case, the status information [7:0] is "10000100".

The row (h) shown in FIG. 21 shows a case where the number of write loops in which the smart verification at the verify voltage AV is passed is four, and the over-programming does not occur when the smart verification is passed. In this case, the status information [7:0] is "00000100".

The NAND flash memory 100 stores the results of the verification obtained by the feedback writing to the second register 170B as status information [7:0], for example. Subsequently, the controller 200 acquires the status information from the second register 170B by an acquisition command, for example, and performs updating of a group representative value or recovery processing, based on the status information as a result of the verification. For example, if the status information [7:0] indicates occurrence of over-programming, the controller 200 transmits a command for the recovery processing to the NAND flash memory 100.

Next, updating of the group representative value and the necessity of the recovery processing based on a result of the verification in the fourth example will be described. FIG. 22 shows updates of group representative values and necessity of the recovery processing based on the status information as the result of the verification. The results of the verification (a) to (h) shown in FIG. 22 are the same as those in FIG. 21.

If the result of the verification is (a) as shown in FIG. 22, there is a high possibility that over-programming occurs; for this reason, the controller 200 decreases the voltage VPGM to be set as a group representative value by three steps to "voltage VPGM−3×ΔV", and performs the recovery processing. In the case of (b) as shown in FIG. 22, although over-programming does not occur, since the group representative value cannot be applied to other word lines, the voltage VPGM to be set as a group representative value is decreased by two steps to "voltage VPGM−2×ΔV", and the recovery processing is not performed. In the case of (c) as shown in FIG. 22, since there is a high possibility that over-programming occurs and the group representative value cannot be applied to other word lines, the voltage VPGM to be set as a group representative value is decreased by one step to "voltage VPGM−ΔV", and the recovery processing is performed. In the case of (d) as shown in FIG. 22, the group representative value can be applied to other word lines, and the voltage VPGM that is set as the group representative value is maintained, and the recovery processing is not performed. In the case of (e) as shown in FIG. 22, since there is a high possibility that over-programming occurs and the group representative value can be applied to other word lines, the VPGM to be set as a group representative value is increased by one step to "voltage VPGM+ΔV", and the recovery processing is performed. In the case of (f) as shown in FIG. 22, although there is a high possibility that over-programming occurs, the voltage VPGM to be set as the group representative value is increased by one step to "voltage VPGM+ΔV", and the recovery processing is not performed. In the case of (g) as shown in FIG. 22, the voltage VPGM to be set as the group representative value is increased by two steps to "voltage VPGM+2×ΔV", and the recovery processing is performed. Furthermore, in the case of (h) as shown in FIG. 22, the voltage VPGM to be set as the group representative value is increased by two steps to "voltage VPGM+2×ΔV", and the recovery processing is not performed.

In the fourth example, after memory cells pass the smart verification using the verify voltage AV, it is determined whether or not the over-programming occurs by performing the OP verify operation using the voltage AVH that is higher than the verify voltage AV. Thus, it is possible to perform the recovery processing for data to be written into a memory cell where the over-programming occurs, and to prevent loss of data in the memory system.

Next, the fifth example in which the second embodiment is adopted as a write operation performed in the first stage of the second-stage programming will be described. In the fifth example, the detection of a write parameter by smart verification is performed using the verify voltage LMV in the "LM" state. If the smart verification is passed, the OP verify operation using the verify voltage LMVH higher than the verify voltage LMV is performed.

Figure 23:
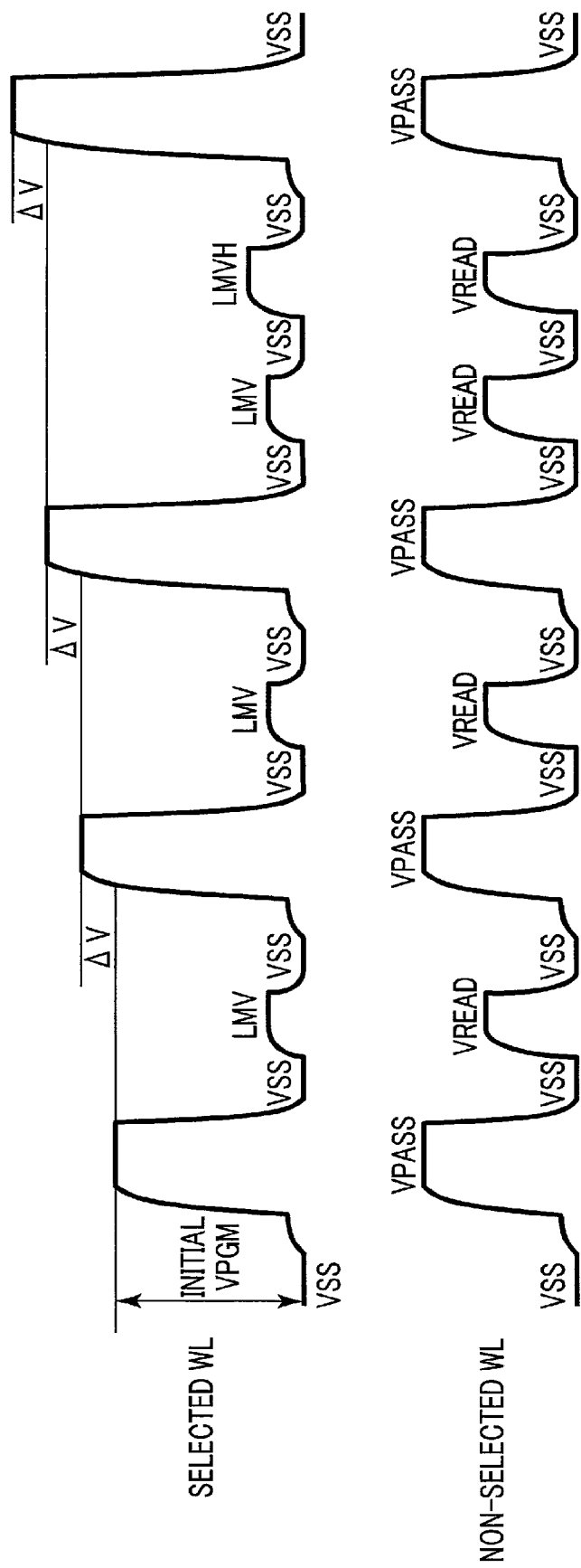
FIG. 23 is a drawing showing word line voltages in a program operation and a verify operation in a feedback writing in an embodiment (a fifth example).

FIG. 23 shows the word line voltages in the program operation and the verify operation performed in the feedback writing in the fifth example. In the fifth example, as shown in FIG. 23, after performing a program operation, a smart verify operation is performed using the program verify voltage LMV as a smart verify voltage. In the smart verify operation, it is determined that the number of memory cells of which the threshold voltages are equal to or higher than the program verify voltage LMV is equal to or greater than the first threshold value. If the smart verification is passed, it is determined whether or not over-programming occurs by the OP verify operation using the verify voltage LMVH higher than the program verify voltage LMV.

The fifth example is an example in which the smart verification using the verify voltage LMV for the "LM" state is passed in the third-time write loop of the write operation. If the smart verification is passed, the OP verify operation by the additional verify voltage LMVH is performed. In the OP verify operation, if the number of memory cells of which threshold voltages are determined to exceed the verify voltage LMVH is equal to or greater than the second threshold value, it is determined that the over-programming occurs at this time.

The NAND flash memory 100 determines status information based on the number of write loops in which the smart verification using the verify voltage LMV is passed and information regarding the occurrence/non-occurrence of the over-programming obtained by the OP verify operation, and stores the status information in the second register 170B. The controller 200 acquires the status information from the second register 170B as a result of the verification, and performs updating of a group representative value and recovery processing based on the status information.

The description of the fourth example with reference to FIGS. 20, 21, and 22 is applicable to the fifth example, if the voltage AV is replaced with the voltage LMV, the voltage AVH is replaced with the voltage LMVH, and "A" is replaced with "LM"; accordingly, the corresponding description for the fifth example is omitted. The rest of the configuration and advantageous effects is the same as those of the fourth example.

Next, the sixth example in which the second embodiment is adopted as a write operation in the second stage of the two-stage programming will be described. In the sixth example, the detection of a write parameter by smart verification is performed using the program verify voltage AV for the "A" state. If the smart verification is passed, the OP verify operation using the verify voltage AVH is performed.

Figure 24:
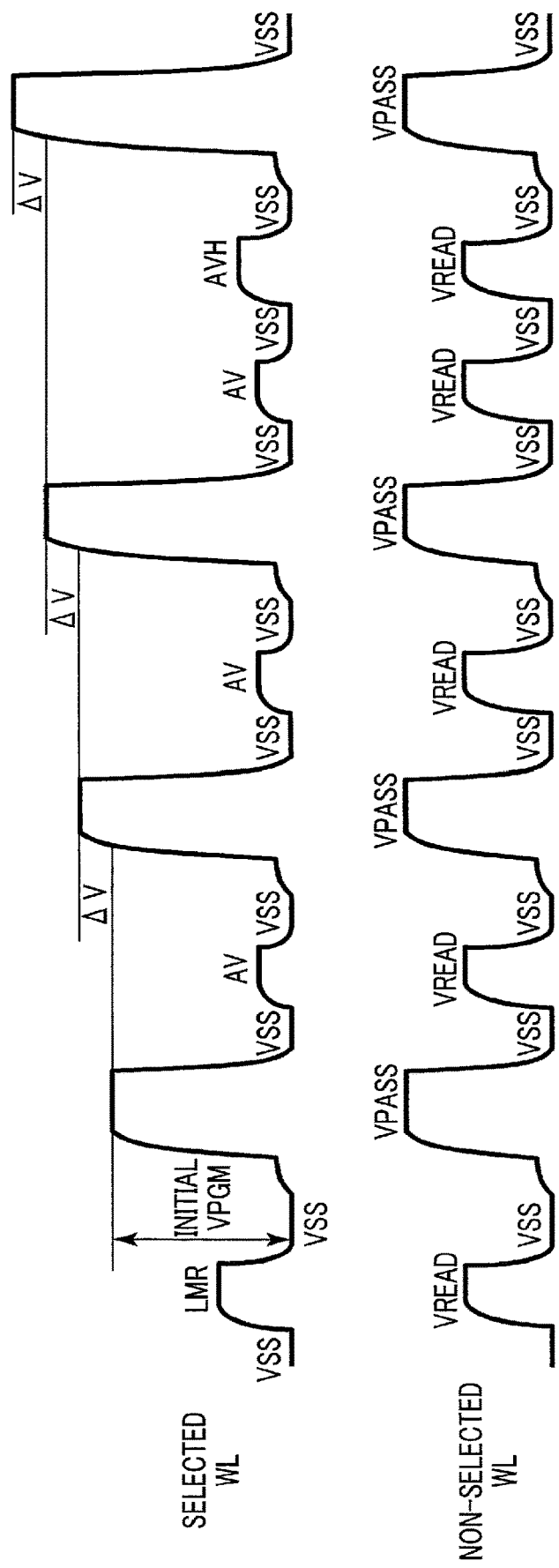
FIG. 24 is a drawing showing word line voltages in a program operation and a verify operation in a feedback writing in an embodiment (a sixth example).

FIG. 24 shows the word line voltages in the program operation and the verify operation performed in the feedback writing in the sixth example. In the sixth example, it is necessary to restore data for a lower page, that is, "LM" data, in order to write eight values in the second stage. For this reason, the read voltage LMR corresponding to "LM" data is used to read the "LM" data. Thereafter, similar to the fourth example, an initial voltage VPGM is applied to a selected word line WL to perform a program operation. After performing a program operation, a smart verify operation is performed using the program verify voltage AV as a smart verify voltage. In the smart verify operation, it is determined that the number of memory cells of which threshold voltages are equal to or higher than the program verify voltage AV is equal to or greater than the first threshold value. If the smart verification is passed, it is determined whether or not the over-programming occurs by the OP verify operation using the verify voltage AVH higher than the program verify voltage AV.

The only difference of the sixth example from the fourth example shown in FIG. 19 is that a read operation at the read voltage LMR is performed prior to the "A" state write operation. The rest of the configuration and advantageous effects are the same as those of the fourth example.

Feedback Writing in Third Embodiment (Seventh to Ninth Examples)

Next, seventh to ninth examples will be described as examples in which the feedback writing of a third embodiment is adopted. In the seventh example, the detection of a write parameter by smart verification is performed using the smart verify voltage SV. If the smart verification is passed, the OP verify operation using the program verify voltage AV for the "A" state is performed. The smart verify voltage SV is lower than the program verify voltage AV for the "A" state.

Figure 26:
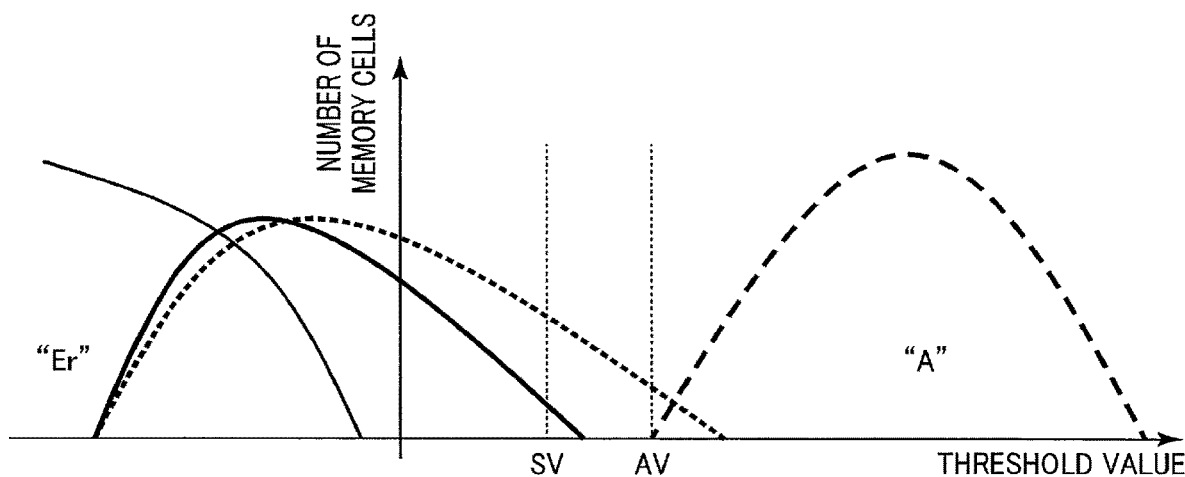
FIG. 26 is a drawing showing threshold voltage distributions of memory cells after a program operation.

FIG. 25 shows the word line voltages in the program operation and the verify operation performed in the feedback writing in the seventh example. FIG. 26 shows the threshold voltage distributions of memory cells after a program operation. In the seventh example, as shown in FIG. 25, after the program operation, the smart verify operation using the smart verify voltage SV is performed, and if the smart verification is passed, the OP verify operation using the program verify voltage AV is performed.

As shown in FIG. 25, in the first write loop, the initial voltage VPGM is applied to a selected word line WL to perform a program operation. Subsequently, the smart verify voltage SV is applied to the selected word line WL to perform a smart verify operation. For example, suppose the number of memory cells of which threshold voltages are determined to be equal to or higher than the smart verify voltage SV is less than the first threshold value, and such memory cells fail the smart verification, the process then proceeds to the second write loop.

In the second write loop, "voltage VPGM+ΔV" is applied to the selected word line WL to perform a program operation. Subsequently, the smart verify voltage SV is applied to the selected word line WL to perform a smart verify operation. Even herein, suppose the number of memory cells, of which threshold voltages are determined to be equal to or higher than the smart verify voltage SV, is less than the first threshold value, and such memory cells fail the smart verification, the process proceeds to the third write loop.

In the third write loop, "voltage VPGM+2×ΔV" is applied to the selected word line WL to perform a program operation. Subsequently, the smart verify voltage SV is applied to the selected word line WL to perform a smart verify operation. Herein, it is determined, for example, that the number of memory cells of which threshold voltages are equal to or higher than the smart verify voltage SV is equal to or greater than the first threshold value, and that the memory cells have passed the smart verification. When the smart verification is passed, the program verify voltage AV for the "A" state higher than the smart verify voltage SV is applied to the selected word line WL, and the OP verify operation using the program verify voltage AV is performed. In the OP verify operation using the program verify voltage AV, if the number of memory cells, of which threshold voltages are determined to exceed the verify voltage AV, is equal to or greater than the second threshold value, it is determined that the over-programming occurs at this time.

As for the method of determining status information based on results of the verification, and updates of the group representative values and the necessity of the recovery processing based on the result of the verification in the seventh example, the voltage AV shown in FIGS. 21 and 22 should be replaced with the voltage SV, and the rest is the same as the fourth example.

In the seventh example, after the memory cells pass the smart verification using the smart verify voltage SV, it is determined whether or not the over-programming occurs by performing the OP verify operation using the program verify voltage AV higher than the smart verify voltage SV. Thus, it is possible to perform the recovery processing for data to be written into a memory cell where the over-programming occurs, and to prevent loss of data in the memory system.

Next, the eighth example in which the third embodiment is adopted as a write operation performed in the first stage of the second-stage programming will be described. In the eighth example, the detection of a write parameter by the smart verification is performed using the smart verify voltage SV. If the smart verification is passed, the OP verify operation using the program verify voltage LMV for the "LM" state is performed. The smart verify voltage SV is lower than the program verify voltage LMV for the "LM" state.

Figure 27:
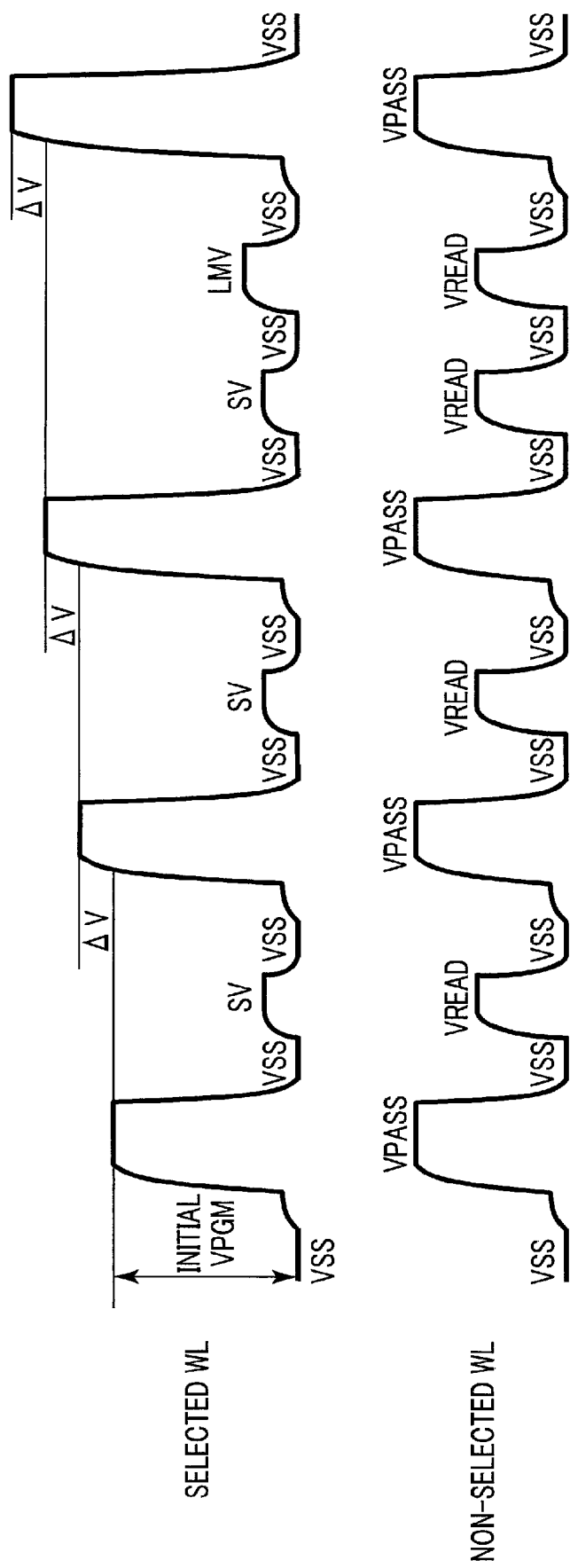
FIG. 27 is a drawing showing word line voltages in a program operation and a verify operation in a feedback writing in an embodiment (an eighth example).

FIG. 27 shows the word line voltages in the program operation and the verify operation performed in the feedback write loop in the eighth example. The eighth example is an example in which the smart verification using the smart verify voltage SV is passed in the third write loop of the write operation. If the smart verification is passed, the program verify voltage LMV for the "LM" state, which is higher than the smart verify voltage SV, is applied to the selected word line WL to perform the OP verify operation. In the OP verify operation, if the number of memory cells, of which threshold voltages are determined to exceed the program verify voltage LMV, is equal to or greater than the second threshold value, it is determined that the over-programming occurs at this time.

The NAND flash memory 100 determines status information based on the number of write loops in which the smart verification using the smart verify voltage SV is passed and information regarding the occurrence/non-occurrence of the over-programming obtained by the OP verify operation, and stores the status information in the second register 170B. The controller 200 acquires the status information as a result of the verification from the second register 170B by an acquisition command, for example, and performs updating of the group representative value and the recovery processing based on the status information.

The description of the fourth example with reference to FIGS. 20, 21, and 22 is applicable to the eighth example, if the voltage AV is replaced with the voltage SV, the voltage AVH is replaced with the voltage LMV, and "A" is replaced with "LM"; accordingly, the description of the eighth example is omitted. The rest of the configuration and advantageous effects is the same as those of the fourth example.

Next, the ninth example in which the third embodiment is adopted as a write operation in the second stage of the two-stage programming will be described. In the ninth example, the detection of a write parameter by the smart verification is performed using the smart verify voltage SV.

If the smart verification is passed, the OP verify operation using the program verify voltage AV for the "A" state is performed. The smart verify voltage SV is lower than the program verify voltage AV for the "A" state.

Figure 28:
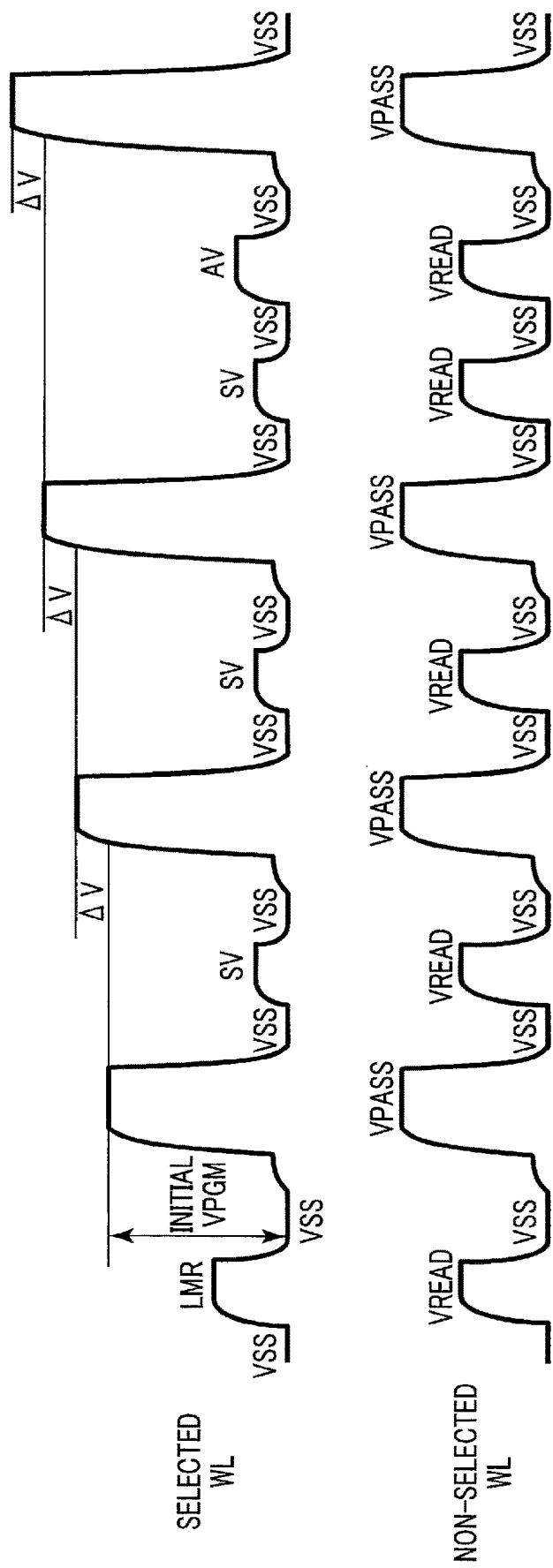
FIG. 28 is a drawing showing word line voltages in a program operation and a verify operation in a feedback writing in an embodiment (a ninth example).

FIG. 28 shows the word line voltages in the program operation and the verify operation performed in the feedback writing in the ninth example. In the ninth example, it is necessary to restore data for a lower page, that is, "LM" data, in order to write eight values in the second stage. For this reason, the read voltage LMR corresponding to "LM" data is used to read the "LM" data. Thereafter, similar to the seventh example, an initial voltage VPGM is applied to a selected word line WL to perform a program operation. After the program operation, the smart verify operation is performed using the smart verify voltage SV. If the smart verification is passed, the OP verify operation using the program verify voltage AV is performed.

The only difference of the ninth example from the seventh example shown in FIG. 25 is that a read operation at the read voltage LMR is performed prior to the "A" state write operation. The rest of the configuration and advantageous effects are the same as those of the seventh example.

1.3 Timing Chart and Command Sequence

Next, a timing chart and a command sequence of the detection writing, the application writing, and the feedback writing of the embodiments will be described with reference to FIGS. 29 to 36.

Figure 29:
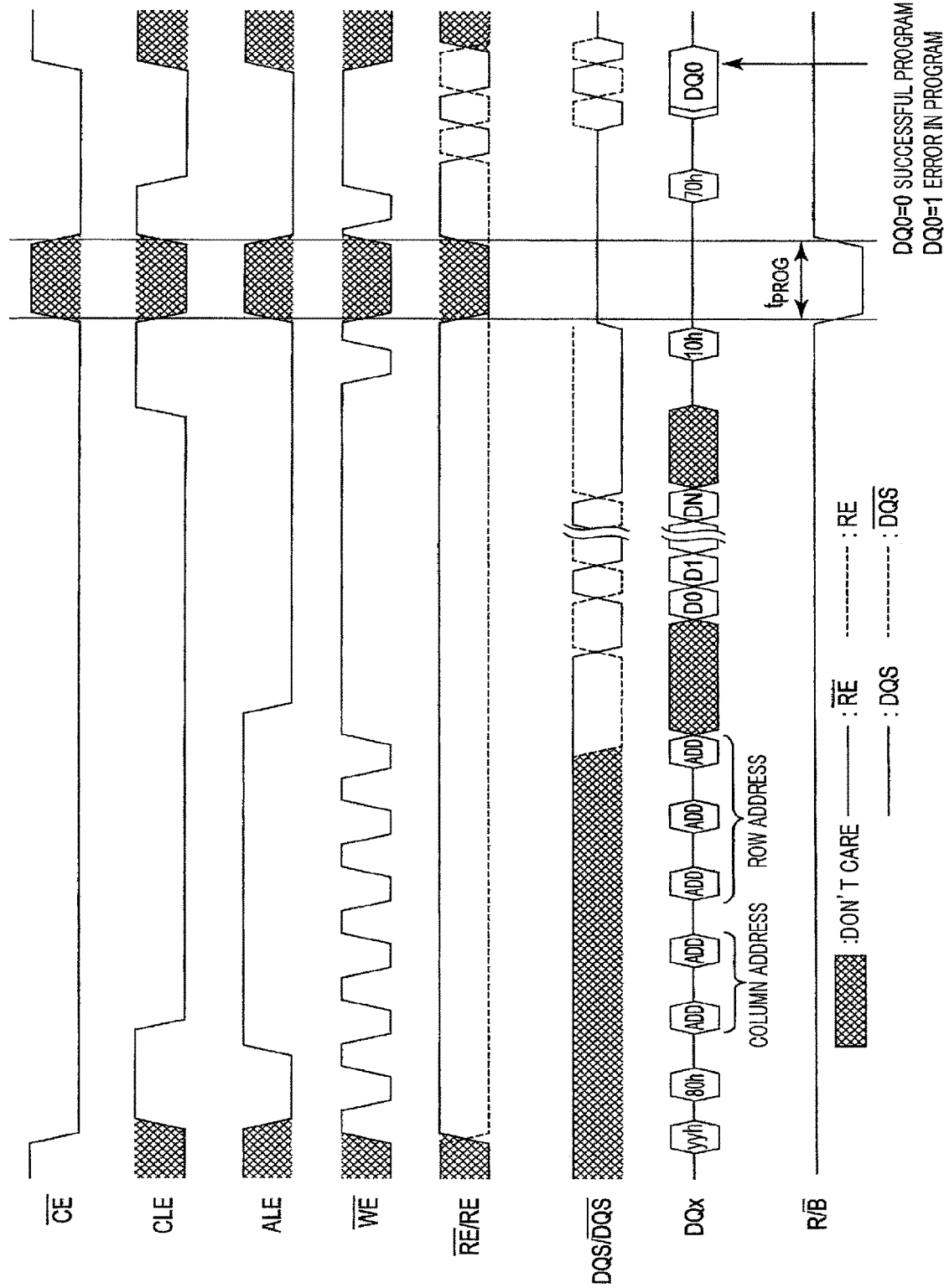
FIG. 29 is a timing chart of page writing in a write operation in embodiments.

FIG. 29 is an example of a timing chart of a page write in the detection writing, the application writing, and the feedback writing of the embodiments. In accordance with this timing chart, the controller 200 instructs the NAND flash memory 100 to perform the detection writing, the application writing, or the feedback writing. The signals in the chart may represent either one of a high active signal (i.e., a positive logical signal) or a low active signal (i.e., a negative logical signal), or both of a positive logical signal and a negative logical signal. A low active signal is expressed by "/" placed before the alphabetical characters representing the signals in the specification and drawings, or by an overline (or overbar) placed above those alphabetical characters.

First, the chip enable signal /CE is asserted, the command latch enable signal CLE is asserted, the address latch enable signal ALE is negated, and the read enable signals /RE and RE, which are a complementary signal, are negated. The write enable signal /WE is asserted, and a prefix command "yyh" through the I/O signal DQx is loaded in the NAND flash memory 100 as a command instructing the detection writing. The I/O signal is a multiple-bit signal, and consists of, for example, DQ0 through DQ7, but the multiple bits are collectively referred to as the I/O signal DQx. When the application writing is instructed, "yxh", not "yyh", is used, and when the feedback writing is instructed, "yzh", not "yyh" or "yxh", is used. Alternatively, the application writing may be instructed by not adding a prefix command.

Next, the command latch enable signal CLE is negated, the address latch enable signal ALE is asserted, and in response to the I/O signal DQx, a column address and a row address of a write target memory cell are loaded in the NAND flash memory 100 in synchronization with the assertion of the write enable signal /WE.

Thereafter, the address latch enable signal ALE is negated, and the write data D0, D1, ..., DN are loaded in the NAND flash memory 100 in synchronization with toggling of data strobe signals DQS and /DQS. The data D0, D1, ..., and DN correspond to one page of data.

After the data is loaded, a command "10h" to start a program in the chip is transmitted through the I/O signal DQx to the NAND flash memory 100, and the program operation is started. During the write period $t_{PROG}$, a ready/busy signal (R/B) is set to a busy state.

Thereafter, a status read command "70h" is transmitted through the I/O signal DQx to the NAND flash memory 100. Subsequently, for example the I/O signal DQ0 is returned from the NAND flash memory 100 to the controller 200. The controller 200 determines whether the program operation succeeds or fails based on the I/O signal DQ0. For example, if the I/O signal DQ0=0, it is determined that the program operation is successful, and if the I/O signal DQ0=1, it is determined that the program operation fails.

The alphabetical characters and numbers used in the drawings to represent the commands are merely examples, and not limited to those used in the drawings.

FIG. 30 shows a command sequence in which the detection writing, the application writing, and the feedback writing based on full-sequence programing are instructed. In accordance with this command sequence, the controller 200 instructs the NAND flash memory 100 to perform the detection writing, the application writing, or the feedback writing. The end A of the top time axis continues to the end A of the middle time axis, and the end B of the middle time axis continues to the end B of the bottom time axis.

As described above, the prefix command "yzh" represents the feedback writing, the prefix command "yyh" represents the detection writing, and the prefix command "yxh" represents the application writing. Any of the detection writing, the application writing, or the feedback writing may thus be instructed by a type of prefix command. Alternatively, the application writing may be instructed by not adding the prefix command. FIG. 30 shows a case where the feedback writing is instructed.

The prefix command "yzh" instructing the feedback writing is transmitted through the I/O signal DQx, and data is transmitted following the prefix command "yzh". The data includes information indicating a write parameter. The NAND flash memory 100 receives the data that follows the prefix command "yzh", and the write parameter is set to the first register 170A according to the data. Herein, the write parameter is transmitted by the data immediately after transmitting the prefix command "yzh"; however, the write parameter may be transmitted by a "Set feature" command. The "Set feature" command will be described later in detail.

After the data is transmitted following the prefix command "yzh", the command "01h" representing a lower page is transmitted, and the command "80h" representing a data input is transmitted. The data input command "80h" may be the same as a usual write command.

Next, similar to the sequence shown in FIG. 29, the column address CA1 and CA2, and the row addresses RA1, RA2, and RA3 are supplied, following the data input command "80h". The data input that follows the row address RA3 corresponds to the write data D0, D1, ..., DN as shown in FIG. 29. The data D0, D1, ..., DN corresponds to data of one page (a lower page).

The command "1Ah" that follows the input of the lower page data is, for example, a command instructing an internal buffer (not shown) in the NAND flash memory 100 to temporarily store the write data. During the transfer of the write data to the internal buffer, the ready/busy signal (R/B) is set to the busy state.

Thereafter, similar to the case of the lower page, write data for a middle page is supplied after the command "02h" representing a middle page is transmitted, and then write data for an upper page is supplied after the command "03h" representing an upper page is transmitted. The command "10h" after the data input to the upper page is a command to start a program in the NAND flash memory 100, and batch writing of the write data to the memory cell array 110 is started by this command. During the write period $t_{PROG}$, a ready/busy signal (R/B) is set to the busy state.

Figure 31:
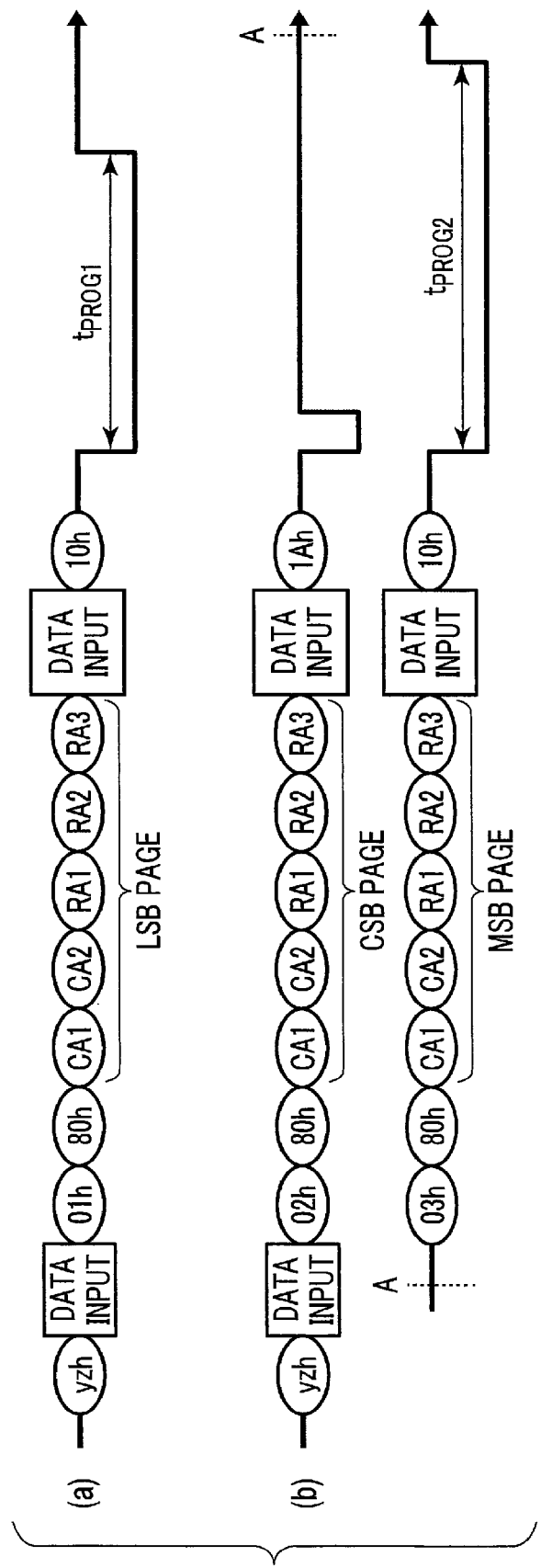
FIG. 31 is a drawing showing a command sequence instructing a write operation based on two-stage programming in embodiments.

In FIG. 31, (a) and (b) show a command sequence in which the detection writing, the application writing, and the feedback writing based on two-stage programming are instructed. In accordance with this command sequence, the controller 200 instructs the NAND flash memory 100 to perform the detection writing, the application writing, or the feedback writing.

In FIG. 31, (a) shows a writing in the first stage; and (b) shows a writing in the second stage. As described above, the prefix command "yzh" represents the feedback writing, the prefix command "yyh" represents the detection writing, and the prefix command "yxh" represents the application writing. Alternatively, the application writing may be instructed by not adding a prefix command. In FIG. 31, (a) and (b) show a case where the feedback writing is instructed.

The writing in the first stage is performed as shown in (a) of FIG. 31. First, the prefix command "yzh" instructing the feedback writing is transmitted through the I/O signal DQx, and data is transmitted following the prefix command "yzh". The NAND flash memory 100 receives the data that follows the prefix command "yzh", and a write parameter is set to the first register 170A based on the data. Instead of the transmission of a write parameter through data, a write parameter may be transmitted by a "Set feature" command.

After the data is transmitted following the prefix command "yzh", the command "01h" representing a lower page is transmitted, and the command "80h" representing a data input is transmitted. Subsequently to the data input command "80h", the column address CA1 and CA2, and the row addresses RA1, RA2, and RA3 are supplied. Following the row address RA3, the write data is supplied.

The command "10h" that follows the supply of the write data for the lower page is a command to start a program in the NAND flash memory 100, and writing of the write data to the memory cell array 110 is started by this command. During the write period $t_{PROG1}$, a ready/busy signal (R/B) is set to the busy state.

Next, the writing in the second stage is performed as shown in (b) of FIG. 31. First, the prefix command "yzh" instructing the feedback writing is transmitted through the I/O signal DQx, and data is transmitted following the prefix command "yzh". The NAND flash memory 100 receives the data that follows the prefix command "yzh", and a write parameter is set to the first register 170A based on the data. Instead of the transmission of a write parameter through data, a write parameter may be transmitted by a "Set feature" command.

After the data is transmitted following the prefix command "yzh", the command "02h" representing a middle page is transmitted, and the command "80h" representing a data input is transmitted. Subsequently to the data input command "80h", the column addresses CA1 and CA2, and the row addresses RA1, RA2, and RA3 are supplied. Following the row address RA3, the write data is supplied. The command "1Ah" that follows the supply of the write data is a command instructing the internal buffer in the NAND flash memory 100 to temporarily store the write data.

Thereafter, similar to the case of the middle page, after the command "03h" representing an upper page is transmitted, write data of an upper page is supplied. The command "10h" after the write data for the upper page is supplied is a command to start a program in the NAND flash memory 100, and writing of the write data to the memory cell array 110 is started by this command. During the write period $t_{PROG2}$, a ready/busy signal (R/B) is set to the busy state.

In FIG. 32, (a) and (b) show a command sequence in which the detection writing, the application writing, and the feedback writing based on foggy-fine programing are instructed. In the foggy-fine programming, data is roughly written in the first stage, and then finely written in the second stage. In accordance with this command sequence, the controller 200 instructs the NAND flash memory 100 to perform the detection writing, the application writing, or the feedback writing.

In FIG. 32, (a) shows a writing in the first stage, and (b) shows a writing in the second stage. As described above, the prefix command "yzh" represents the feedback writing, the prefix command "yyh" represents the detection writing, and the prefix command "yxh" represents the application writing. Alternatively, the application writing may be instructed by not adding the prefix command. In FIG. 32, (a) and (b) show a case where the feedback writing is instructed.

The writing in the first stage is performed as shown in (a) of FIG. 32. First, the prefix command "yzh" instructing the feedback writing is transmitted through the I/O signal DQx, and data is transmitted following the prefix command "yzh". The NAND flash memory 100 receives the data that follows the prefix command "yzh", and a write parameter is set to the first register 170A based on the data. Instead of the transmission of a write parameter through data, a write parameter may be transmitted by a "Set feature" command.

After the data is transmitted following the prefix command "yzh", the command "01h" representing a lower page is transmitted, and the command "80h" representing a data input is transmitted. Subsequently to the data input command "80h", the column address CA1 and CA2, and the row addresses RA1, RA2, and RA3 are supplied. Following the row address RA3, the write data is supplied. The command "1Ah" after the write data for a lower page is supplied is a command instructing the internal buffer in the NAND flash memory 100 to temporarily store the write data.

Thereafter, similar to the case of the lower page, after the command "02h" representing a middle page is transmitted, write data for a middle page is supplied. The command "1Ah" that follows the supply of the write data for the middle page is a command instructing the internal buffer in the NAND flash memory 100 to temporarily store the write data.

Thereafter, similar to the case of the middle page, after the command "03h" representing an upper page is transmitted, write data of an upper page is supplied. The command "10h" that follows the supply of the write data for the upper page is a command to start a program in the NAND flash memory 100, and writing of the write data to the memory cell array 110 is started by this command. During the write period tPROGF1, a ready/busy signal (R/B) is set to the busy state.

Next, the writing in the second stage is performed as shown in (b) of FIG. 32. First, the prefix command "yzh" instructing the feedback writing is transmitted by the I/O signal DQx, and data is transmitted following the prefix command "yzh". The NAND flash memory 100 receives the data that follows the prefix command "yzh", and a write parameter is set to the first register 170A based on the data. Instead of the transmission of a write parameter through data, a write parameter may be transmitted by a "Set feature" command.

After the data is transmitted following the prefix command "yzh", the command "01h" representing a lower page is transmitted, and the command "80h" representing a data input is transmitted. Subsequently to the data input command "80h", the column addresses CA1 and CA2 and the row addresses RA1, RA2, and RA3 are supplied. Following the row address RA3, the write data is supplied. The command "1Ah" that follows the supply of the write data for a lower page is a command instructing the internal buffer in the NAND flash memory 100 to temporarily store the write data.

Thereafter, similar to the case of the lower page, after the command "02h" representing a middle page is transmitted, write data for a middle page is supplied. The command "1Ah" that follows the supply of the write data for the middle page is a command instructing the internal buffer in the NAND flash memory 100 to temporarily store the write data.

Thereafter, similar to the case of the middle page, after the command "03h" representing an upper page is transmitted, write data for an upper page is supplied. The command "10h" after the write data for the upper page is supplied is a command to start a program in the NAND flash memory 100, and writing of the write data to the memory cell array 110 is started by this command. During the write period tPROGF2, a ready/busy signal (R/B) is set to the busy state.

Next, as an implementing example in which the controller 200 acquires from the NAND flash memory 100 a result of verification as a result of the detection writing and the feedback writing, a case where a status read command or a "Get feature" command is used will be described.

Figure 33:
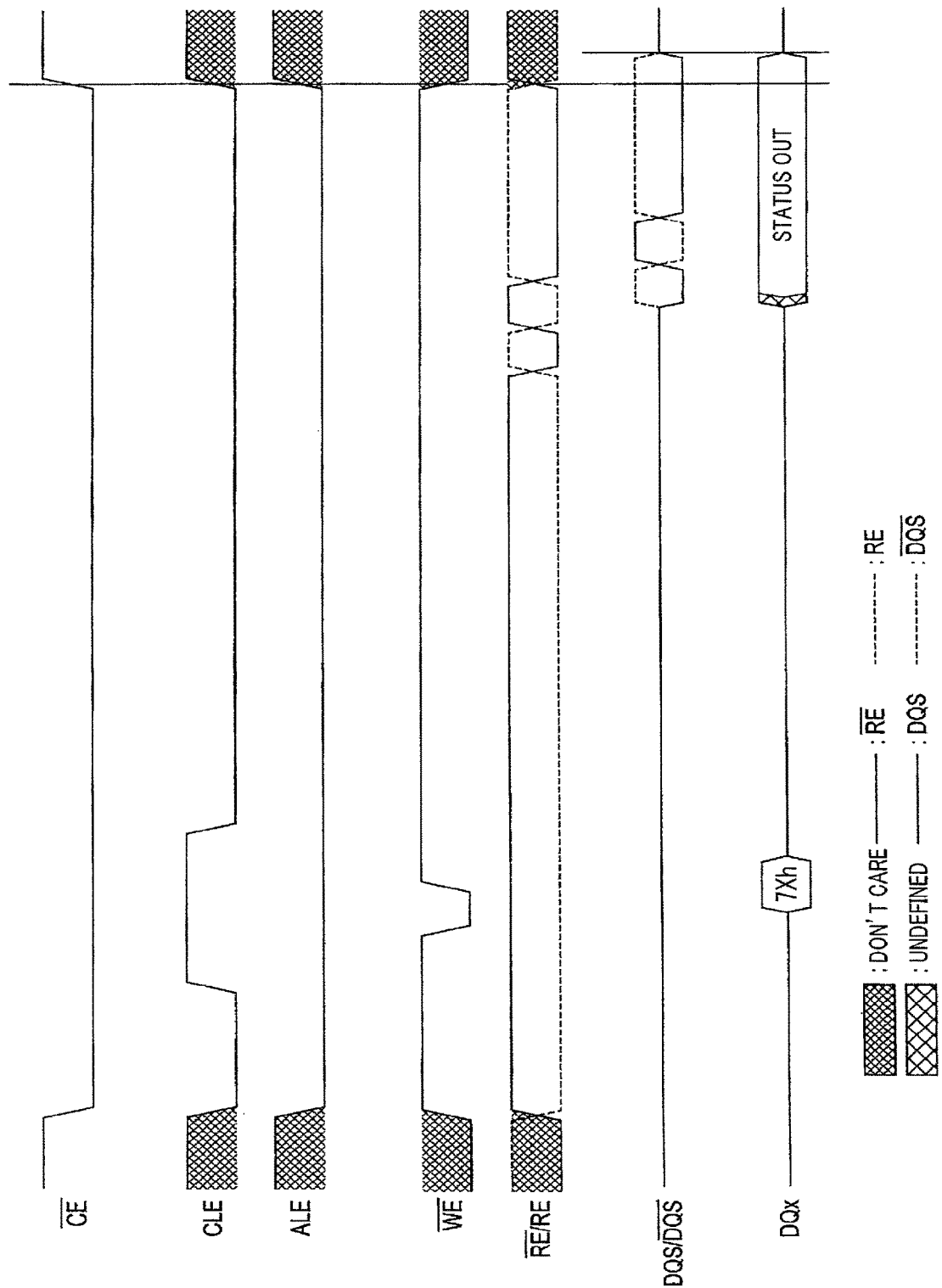
FIG. 33 is a drawing showing an example of how results of verification are obtained from a detection writing and a feedback writing using a status read command.

First, a case where a result of verification is obtained from the NAND flash memory 100 by the controller 200 by using a status read command will be described. FIG. 33 shows a timing chart of the status read command for reading a result of verification in the detection writing or the feedback writing. In accordance with the timing chart, the controller 200 instructs the NAND flash memory 100 to perform a status read operation. FIG. 34 shows the details of status information that is output in response to the status read command.

First, the chip enable signal /CE is asserted, the command latch enable signal CLE is asserted, the address latch enable signal ALE is negated, and the read enable signals /RE and RE, which are a complementary signal, are negated. The write enable signal /WE is asserted, and the command "7Xh" through the I/O signal DQx is loaded in the NAND flash memory 100 as a command instructing the status read operation.

Next, the command latch enable signal CLE is negated, and the status information is obtained from the second register 170B in synchronization with toggling of the read enable signals /RE and RE. The status information is then output from the NAND flash memory 100 to the controller 200 in synchronization with toggling of the data strobe signals DQS and /DQS. As shown in FIG. 34, among the status information IO7 through IO0 that is output in response to the status read command transmitted from the controller 200, IO4 through IO2 include a result of verification, for example. In a case where the NAND flash memory 100 has blocks and is capable of writing in parallel to blocks, IO0 and IO1 are information indicating whether a write operation performed to each block has passed or failed. When one block is written in response to the prefix command, IO0 or IO1 represents the status described above. An explanation for the other information is omitted.

Figure 35:
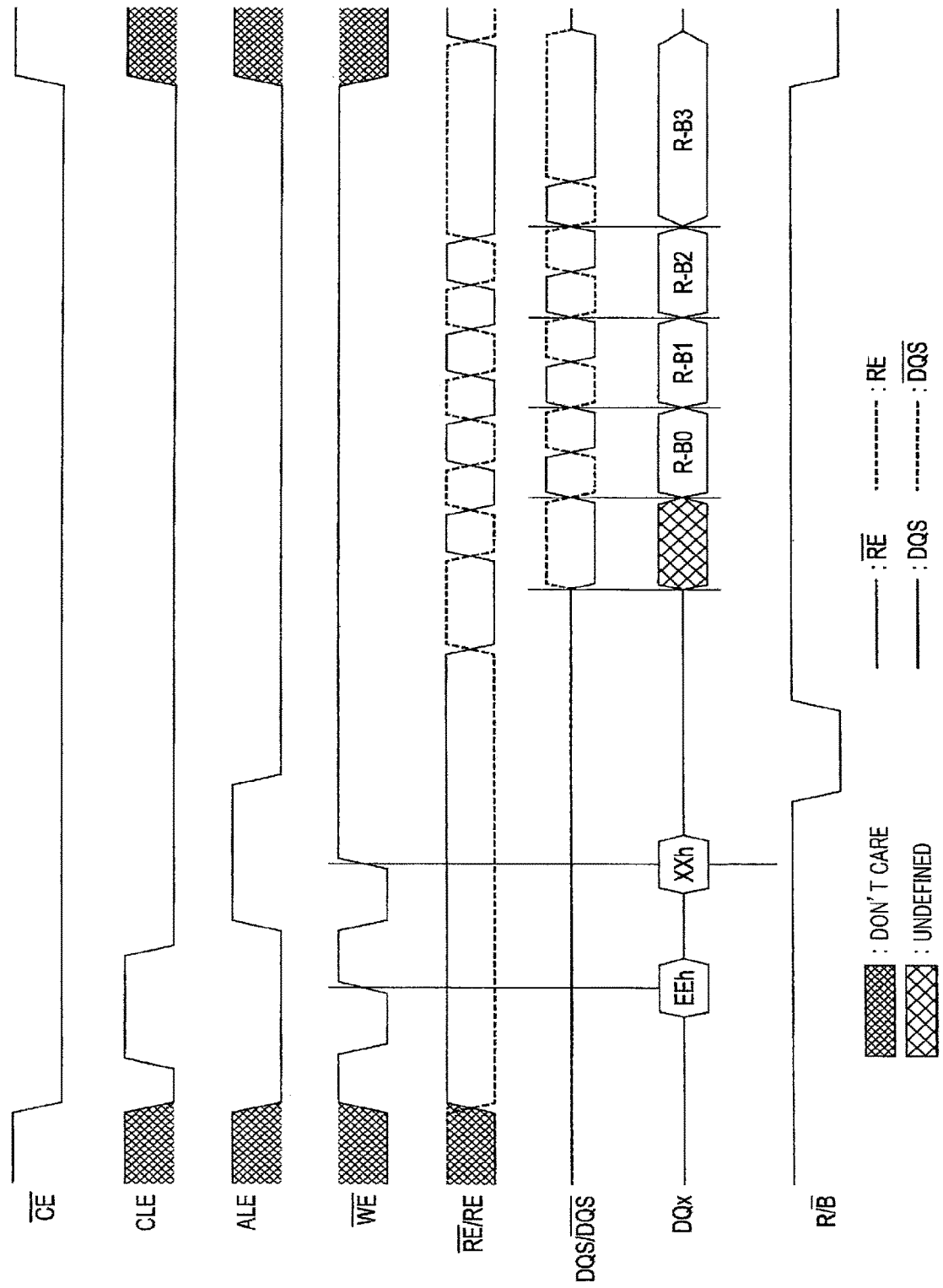
FIG. 35 is a drawing showing an example of how results of verifications are obtained from a detection writing and a feedback writing using a "Get feature" command.

Next, a case where a result of checking is obtained from the NAND flash memory 100 by the controller 200 by using a "Get feature" command will be described. FIG. 35 shows a timing chart of the "Get feature" command for obtaining the result of checking in the detection writing or the feedback writing. The controller 200 instructs the NAND flash memory 100 to perform a "Get feature" operation in accordance with the timing chart. The "Get feature" operation is to obtain data R-B0, R-B1, R-B2, and R-B3 from the address "XXh" of the second register 170B. Suppose information indicating a write parameter is stored in the address "XXh" in the second register 170B.

First, the chip enable signal /CE is asserted, and the command latch enable signal CLE, the address latch enable signal ALE, the write enable signal /WE, and the read enable signal /RE and RE are negated.

Thereafter, the command latch enable signal CLE and the write enable signal /WE are asserted, and the command "EEh" is transmitted through I/O signal DQx. "EEh" of the I/O signal DQx is loaded in the NAND flash memory 100 in synchronization of a rising edge of the write enable signal /WE. The command "EEh" instructs starting of the "Get feature" operation.

Next, the command latch enable signal CLE is negated, and the address latch enable signal ALE and the write enable signal /WE are asserted, and "XXh" is transmitted through the I/O signal DQx. "XXh" of the I/O signal DQx is loaded in the NAND flash memory 100 in synchronization with a rising edge of the write enable signal /WE.

Thereafter, the address latch enable signal ALE is negated, and R-B0, R-B1, R-B2, and R-B3 are transmitted to the controller 200 through the I/O signal DQx. In response to toggling of the read enable signals /RE and RE by the controller 200, the NAND flash memory 100 toggles the data strobe signals DQS and /DQS. In synchronization with toggling of the data strobe signals DQS and /DQS, R-B0, R-B1, R-B2, and R-B3 of the I/O signal DQx are acquired as data by the controller 200. The controller 200 stores a write parameter based on the acquired data as a group representative value in the write parameter table 220A_2. Thus, the information indicating the write parameter stored in the second register 170B of the NAND flash memory 100 is transmitted to the controller 200 by the "Get feature" command.

Next, as an implementing example in which a write parameter is set to the first register 170A of the NAND flash memory 100 in the detection writing and the feedback writing, a case where a "Set feature" command is used will be described.

Figure 36:
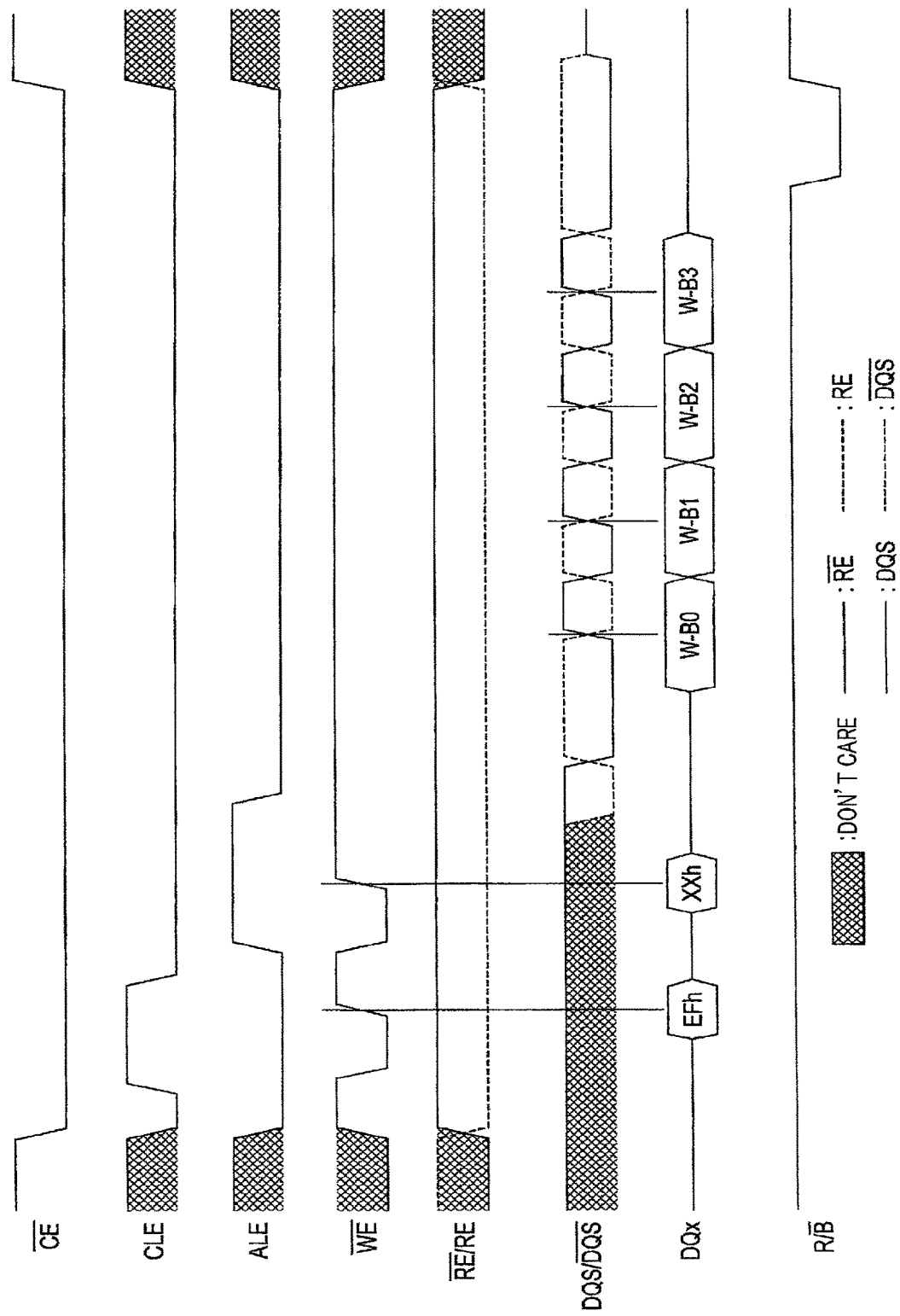
FIG. 36 is a drawing showing an example in which write parameters for a detection writing and a feedback writing are set using a "Set feature" command.

FIG. 36 shows a timing chart of the "Set feature" command for setting a write parameter in the first register 170A in the detection writing and the feedback writing. In accordance with the timing chart, the controller 200 instructs the NAND flash memory 100 to perform a "Set feature" operation. The "Set feature" command is used to set the data W-B0, W-B1, W-B2, and W-B3 each representing a write parameter in the first register 170A having the address "XXh" of the NAND flash memory 100.

First, the chip enable signal /CE is asserted, and the command latch enable signal CLE, the address latch enable signal ALE, the write enable signal /WE, and the read enable signals /RE and RE are negated.

Thereafter, the command latch enable signal CLE and the write enable signal /WE are asserted, and "EFh" is transmitted through the I/O signal DQx. "EFh" of the I/O signal DQx is loaded in the NAND flash memory 100 in synchronization with a rising edge of the write enable signal /WE. The command "EFh" instructs starting of the "Set feature" operation.

Next, the command latch enable signal CLE is negated, and the address latch enable signal ALE and the write enable signal /WE are asserted, and "XXh" is transmitted through the I/O signal DQx. "XXh" of the I/O signal DQx is loaded as an address in the NAND flash memory 100 in synchronization with a rising edge of the write enable signal /WE.

Thereafter, the address latch enable signal ALE is negated, and the data W-B0, W-B1, W-B2, and W-B3 each representing a write parameter are transmitted through the I/O signal DQx to the NAND flash memory 100. In synchronization with toggling of the data strobe signals DQS and /DQS, W-B0, W-B1, W-B2, and W-B3 of the I/O signal DQx are loaded as data in the NAND flash memory 100. The data W-B0, W-B1, W-B2, and W-B3 loaded in the NAND flash memory 100 is set in the address "XXh" of the first register 170A. Thus, the group representative value stored in the write parameter table 220A_2 in the controller 200 is stored in the first register 170A as a write parameter by the "Set feature" operation.

1.4 Advantageous Effects of Embodiments

According to the embodiments, by providing a verify operation using an additional verify voltage to the program verify operation in the write operation, it is checked whether or not current write parameter is too small, appropriate, or excessive with respect to a write target memory cell, or whether or not over-programming occurs because of the excessive current write parameter, and a write parameter to be used in the next write operation is dynamically adjusted based on a result of checking.

It is thus possible to use an adjusted write parameter to perform a program operation in the next cycle of the write operation, thereby reducing the number of times the write loop is repeated and improving the performance of the write operation. Furthermore, when it is determined that over-programming occurs in a memory cell, recovery processing can be performed so that data to be written into the memory cell where the over-programming occurs can be recovered, thereby preventing loss of data in the memory system. It is thus possible to improve the performance of data write.

2. Other Modifications, Etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A memory system comprising:
a non-volatile semiconductor memory that includes a first memory cell, the first memory cell being configured to store data in accordance with a threshold voltage thereof; and
a controller including a memory, the controller being configured to:
instruct the non-volatile semiconductor memory to perform a first write operation to the first memory cell to store first data therein using a first write voltage, wherein the first write operation includes first loops in each of which one of the first write voltage and voltages obtained by incrementing the first write voltage is applied to the first memory cell, and the first write voltage is applied to the first memory cell in an initial loop of the first loops;
obtain a second write voltage in the first write operation by comparing the threshold voltage of the first memory cell to a first verify voltage, the second write voltage being higher than the first write voltage;
store a value of the second write voltage in the memory;
instruct the non-volatile semiconductor memory to perform a second write operation to the first memory cell to store the first data therein using the second write voltage, wherein the second write operation includes second loops in each of which one of the second write voltage and voltages obtained by incrementing the second write voltage is applied to the first memory cell, and the second write voltage is applied to the first memory cell in an initial loop of the second loops;
in response to receiving, from the non-volatile semiconductor memory, a result of checking of the second write voltage which is obtained in the second write operation, the result of checking indicating whether the threshold voltage of the first memory cell written by the second write operation exceeds a second verify voltage, the second verify voltage being different from the first verify voltage;
update the value of the second write voltage stored in the memory to a third write voltage on the basis of the result of checking of the second write voltage, the third write voltage being different from the second write voltage; and
instruct the non-volatile semiconductor memory to perform a third write operation to the first memory cell to store the first data therein using the third write voltage, wherein the third write operation includes third loops in each of which one of the third write voltage and voltages obtained by incrementing the third write voltage is applied to the first memory cell, and the third write voltage is applied to the first memory cell in an initial loop of the third loops.

2. The memory system according to claim 1, wherein
the second write operation includes a program operation and a program verify operation,
the program operation is an operation of writing the first data into the first memory cell by applying one of the second write voltage and the voltages obtained by incrementing the second write voltage to the first memory cell,
the program verify operation includes a first verify operation in which the threshold voltage of the first memory cell is verified by using a third verify voltage corresponding to the first data, and a second verify operation in which the threshold voltage of the first memory cell is verified by using the second verify voltage different from the third verify voltage.

3. The memory system according to claim 2, wherein
the second verify operation includes a plurality of verify operations, each verify operation using any one of a plurality of verify voltage levels as the second verify voltage.

4. The memory system according to claim 2, wherein
the first memory cell is one of a plurality of memory cells included in the non-volatile semiconductor memory, and
the result of checking of the second write voltage includes information that indicates whether a number of memory cells which are a target of the second write operation and whose threshold voltage levels reach the second verify voltage is greater than a threshold value.

5. The memory system according to claim 2, wherein
the second verify operation is performed during the program verify operation which is initially performed in the second write operation.

6. The memory system according to claim 2, wherein
the first verify operation verifies whether the threshold voltage of the first memory cell reaches the third verify voltage, and
the program operation and the program verify operation are repeated in the second write operation while the threshold voltage of the first memory cell does not reach the third verify voltage.

7. The memory system according to claim 2, wherein
the first memory cell is one of a plurality of memory cells included in the non-volatile semiconductor memory, and
the second verify operation is performed when threshold voltage levels of the plurality of memory cells reach the third verify voltage.

8. The memory system according to claim 7, wherein
the result of checking of the second write voltage includes at least one of information that indicates a number of second loops executed until the threshold voltage levels of the plurality of memory cells reach the third verify voltage, each of the second loops including the program operation and the program verify operation, and information that indicates whether the threshold voltage levels of the plurality of memory cells reach the second verify voltage.

9. The memory system according to claim 2, wherein
the first memory cell is one of a plurality of memory cells included in the non-volatile semiconductor memory,
the second verify voltage is lower than the third verify voltage,
the second verify operation is performed, and
when threshold voltage levels of the plurality of memory cells in the second verify operation do not reach the second verify voltage, the first verify operation is not performed.

10. The memory system according to claim 2, wherein
the second verify operation is performed when a number of write/erase operations performed to the first memory cell reaches a predetermined number.

11. The memory system according to claim 2, wherein
the first memory cell is one of a plurality of memory cells included in the non-volatile semiconductor memory, and
a second loop including the program operation and the program verify operation is repeated in the second write operation, and when threshold voltage levels of the plurality of memory cells do not reach the third verify voltage, a step-up writing, in which the first data is written by using an incremented write voltage in the program operation of a next second loop, is further performed in the second write operation.

12. The memory system according to claim 1, wherein
the controller is further configured to:
determine Whether over-programming has occurred in the first memory cell on the basis of the result of checking of the second write voltage, and,
when it is determined that the over-programming has occurred, the controller obtain the first data to be written into the first memory cell where the over-programming has occurred, and perform recovery processing to the non-volatile semiconductor memory to write the obtained first data.

13. The memory system according to claim 1, wherein
the non-volatile semiconductor memory comprises a group including the first memory cell and a plurality of other memory cells, and the second write voltage is used in common to the memory cells of the group in the second write operation.

14. The memory system according to claim 1, wherein
the second write voltage is a first value that is obtained by the controller from the memory, or a second value calculated from a third value that is obtained by the controller from the memory.

15. The memory system according to claim 1, wherein
the third write voltage is lower than the second write voltage.

16. A semiconductor memory device comprising:
a memory cell;
a first register configured to store a write parameter used in a write operation to the memory cell; and
a second register configured to store a result of checking of the write parameter obtained in the write operation, wherein
the write operation includes a program operation and a program verify operation,
the program operation is an operation of writing write data into the memory cell by using the write parameter,
the program verify operation includes a first verify operation in which a threshold voltage of the memory cell is verified by using a first verify voltage corresponding to the write data, and a second verify operation in which the threshold voltage of the memory cell is verified by using a second verify voltage different from the first verify voltage, wherein
the memory cell is one of a plurality of memory cells,
the second verify voltage is lower than the first verify voltage,
the second verify operation is performed, and
when threshold voltage levels of the memory cells in the second verify operation do not reach the second verify voltage, the first verify operation is not performed.

17. The semiconductor memory device according to claim 16, wherein
the second verify operation includes a plurality of verify operations, each verify operation using any one of a plurality of verify voltage levels as the second verify voltage.

18. The semiconductor memory device according to claim 16, wherein
the result of checking of the write parameter includes information that indicates whether a number of memory cells which are a target of the write operation and whose threshold voltage levels reach the second verify voltage is greater than a threshold value.

19. The semiconductor memory device according to claim 16, wherein
the second verify operation is performed during the program verify operation which is initially performed in the write operation.

20. The semiconductor memory device according to claim 16, wherein
the first verify operation verifies whether the threshold voltage of the memory cell reaches the first verify voltage, and
the program operation and the program verify operation are repeated in the write operation while the threshold voltage of the memory cell does not reach the first verify voltage.

21. A memory system comprising:
a non-volatile semiconductor memory that includes a plurality of memory cells connected to a word line; and
a controller having a memory configured to store a value of a write voltage used in a write operation to the non-volatile semiconductor memory, the write operation including loops, the controller being configured to:
instruct the non-volatile semiconductor memory to perform the write operation to the plurality of memory cells by applying the write voltage to the word line first among the loops; and
in response to receiving, from the non-volatile semiconductor memory, a result indicating whether over-programming has occurred on at least one of the plurality of memory cells, lower the value of the write voltage stored in the memory in a case that the result indicates the over-programming has occurred.

22. The memory system according to claim 21, wherein
the write operation includes a program operation and a program verify operation,
the program operation is an operation of writing write data into the plurality of memory cells by applying the write voltage to the word line,
the program verify operation includes a first verify operation in which threshold voltages of the plurality of memory cells are verified by applying a first verify voltage to the word line, the first verify voltage corresponding to the write data, and a second verify operation in which the threshold voltages of the plurality of memory cells are verified by applying a second verify voltage to the word line, the second verify voltage being different from the first verify voltage, wherein
the second verify voltage is lower than the first verify voltage,
the second verify operation is performed, and
when the threshold voltages of the plurality of memory cells in the second verify operation do not reach the second verify voltage, the first verify operation is not performed.

* * * * *